US010158197B2

(12) United States Patent
Little et al.

(10) Patent No.: US 10,158,197 B2
(45) Date of Patent: Dec. 18, 2018

(54) FLIPPABLE ELECTRICAL CONNECTOR

(71) Applicant: FOXCONN INTERCONNECT TECHNOLOGY LIMITED, Grand Cayman (KY)

(72) Inventors: Terrance F. Little, Fullerton, CA (US); Chih-Pi Cheng, New Taipei (TW); Shuo-Hsiu Hsu, New Taipei (TW); Wei-Hao Su, New Taipei (TW)

(73) Assignee: FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 0 days.

(21) Appl. No.: 15/295,992

(22) Filed: Oct. 17, 2016

(65) Prior Publication Data
US 2017/0040750 A1 Feb. 9, 2017

Related U.S. Application Data

(63) Continuation of application No. 14/664,935, filed on Mar. 23, 2015, now Pat. No. 9,484,681, and a
(Continued)

(51) Int. Cl.
*H01R 13/6587* (2011.01)
*H01R 13/6597* (2011.01)
(Continued)

(52) U.S. Cl.
CPC ....... *H01R 13/6587* (2013.01); *H01R 12/724* (2013.01); *H01R 13/502* (2013.01);
(Continued)

(58) Field of Classification Search
CPC ............ H01R 23/6873; H01R 13/6597; H01R 13/6593; H01R 13/6594; H01R 13/6595
(Continued)

(56) References Cited

U.S. PATENT DOCUMENTS 5,073,130 A   12/1991  Hosiden
6,755,689 B2  1/2004   Zhang et al.
(Continued)

FOREIGN PATENT DOCUMENTS

CN   1253402 A   5/2000
CN   2454802 Y   10/2001
(Continued)

OTHER PUBLICATIONS

Universal Serial Bus Type-C Cable and Connector Specification Revision 0.7 Working Draft Jan. xx, 2014, p. 13-14,20-21,33,38.
(Continued)

*Primary Examiner* — Tulsidas C Patel
*Assistant Examiner* — Marcus Harcum
(74) *Attorney, Agent, or Firm* — Wei Te Chung; Ming Chieh Chang

(57) ABSTRACT

A receptacle connector for use with a plug, includes an insulative housing defining a base and a mating tongue extending, with a widen and thicken step portion defined at a root region of the mating tongue; a plurality of contacts disposed in the housing with contacting sections exposed upon the first and second surfaces of the mating tongue and categorized with signal contacts, power contacts and grounding contacts. Each of first and second surfaces of the step portion is fitly surrounded with a metallic plate, the metallic plate mechanically and electrically connects to the corresponding grounding contact.

14 Claims, 58 Drawing Sheets

Related U.S. Application Data continuation-in-part of application No. 14/558,732, filed on Dec. 3, 2014, now Pat. No. 9,490,594, said application No. 14/664,935 is a continuation of application No. 14/497,205, filed on Sep. 25, 2014, now Pat. No. 9,472,910, said application No. 14/664,935 is a continuation-in-part of application No. 14/477,889, filed on Sep. 5, 2014, now Pat. No. 9,525,223, said application No. 14/664,935 is a continuation-in-part of application No. 14/454,737, filed on Aug. 8, 2014, now Pat. No. 9,525,227, said application No. 14/664,935 is a continuation-in-part of application No. 14/337,180, filed on Jul. 21, 2014, now Pat. No. 9,318,853, said application No. 14/664,935 is a continuation-in-part of application No. 14/542,550, filed on Nov. 15, 2014, now Pat. No. 9,350,126, and a continuation-in-part of application No. 14/517,941, filed on Oct. 20, 2014, now Pat. No. 9,496,662.

(60) Provisional application No. 61/969,823, filed on Mar. 24, 2014, provisional application No. 61/940,815, filed on Feb. 17, 2014, provisional application No. 61/943,310, filed on Feb. 22, 2014, provisional application No. 61/949,232, filed on Mar. 6, 2014, provisional application No. 61/917,363, filed on Dec. 18, 2013, provisional application No. 61/923,270, filed on Jan. 11, 2014, provisional application No. 61/916,147, filed on Dec. 14, 2013, provisional application No. 61/919,681, filed on Dec. 20, 2013, provisional application No. 61/875,096, filed on Sep. 8, 2013, provisional application No. 61/863,896, filed on Aug. 8, 2013, provisional application No. 61/866,037, filed on Aug. 14, 2013, provisional application No. 61/867,584, filed on Aug. 19, 2013, provisional application No. 61/856,077, filed on Jul. 19, 2013, provisional application No. 61/857,687, filed on Jul. 23, 2013, provisional application No. 61/899,276, filed on Nov. 3, 2013.

(51) Int. Cl.
| | | |
|---|---|---|
| *H01R 13/627* | (2006.01) | |
| *H01R 24/60* | (2011.01) | |
| *H01R 12/72* | (2011.01) | |
| *H01R 13/6582* | (2011.01) | |
| *H01R 13/502* | (2006.01) | |
| *H01R 107/00* | (2006.01) | |
| *H05K 1/11* | (2006.01) | |
| *H05K 1/18* | (2006.01) | |

(52) U.S. Cl.
CPC ..... *H01R 13/6275* (2013.01); *H01R 13/6582* (2013.01); *H01R 13/6597* (2013.01); *H01R 24/60* (2013.01); *H01R 2107/00* (2013.01); *H05K 1/117* (2013.01); *H05K 1/184* (2013.01); *H05K 2201/09063* (2013.01); *H05K 2201/10189* (2013.01)

(58) Field of Classification Search
USPC .................. 439/607.37, 607.34, 607.4, 660
See application file for complete search history.

(56) References Cited

U.S. PATENT DOCUMENTS

| | | | |
|---|---|---|---|
| 7,320,618 B2 | 1/2008 | Tai | |
| 7,699,663 B1* | 4/2010 | Little | H01R 13/6471 439/660 |
| 7,727,026 B2* | 6/2010 | Qin | H01R 13/7033 439/660 |
| 7,758,379 B2* | 7/2010 | Chen | H01R 13/6485 439/607.11 |
| 7,837,506 B1* | 11/2010 | Chiang | H01R 12/707 439/607.27 |
| 8,087,944 B2 | 1/2012 | Kumamoto et al. | |
| 8,100,720 B2* | 1/2012 | Lin | H01R 27/00 439/607.34 |
| 8,109,795 B2* | 2/2012 | Lin | H01R 13/6461 439/660 |
| 8,262,414 B1* | 9/2012 | Li | H01R 13/6273 439/607.35 |
| 8,485,851 B2* | 7/2013 | Kondo | H01R 13/6474 439/660 |
| 8,517,773 B2 | 8/2013 | Lee et al. | |
| 8,851,927 B2* | 10/2014 | Hsu | H01R 12/724 439/607.11 |
| 8,968,031 B2 | 3/2015 | Simmel | |
| 9,178,319 B2* | 11/2015 | Little | H01R 13/6585 |
| 9,281,642 B1 | 3/2016 | Tseng et al. | |
| 9,300,095 B2 | 3/2016 | Lin et al. | |
| 9,312,641 B2 | 4/2016 | Wang et al. | |
| 9,318,856 B2 | 4/2016 | MacDougall et al. | |
| 9,379,499 B2 | 6/2016 | Miyoshi et al. | |
| 2007/0049100 A1 | 3/2007 | Tsai | |
| 2008/0003881 A1 | 1/2008 | Wu | |
| 2009/0011624 A1* | 1/2009 | Yamazaki | H01R 9/034 439/99 |
| 2009/0156027 A1 | 6/2009 | Chen | |
| 2010/0267261 A1 | 10/2010 | Lin et al. | |
| 2012/0231661 A1* | 9/2012 | Song | H01R 12/707 439/607.4 |
| 2013/0095702 A1 | 4/2013 | Golko et al. | |
| 2013/0329324 A1* | 12/2013 | Tziviskos | H05K 5/0247 361/56 |
| 2014/0024257 A1* | 1/2014 | Castillo | H01R 13/6585 439/607.05 |
| 2015/0162684 A1 | 6/2015 | Amini et al. | |
| 2015/0171562 A1 | 6/2015 | Gao et al. | |
| 2015/0214673 A1 | 7/2015 | Gao et al. | |
| 2015/0214674 A1 | 7/2015 | Simmel et al. | |
| 2015/0295362 A1 | 10/2015 | Tziviskos et al. | |
| 2015/0340813 A1 | 11/2015 | Ng et al. | |
| 2015/0340815 A1 | 11/2015 | Gao et al. | |
| 2015/0340825 A1 | 11/2015 | Ng et al. | |
| 2016/0118752 A1 | 4/2016 | Guo et al. | |

FOREIGN PATENT DOCUMENTS

| | | |
|---|---|---|
| CN | 2655454 Y | 11/2004 |
| CN | 2724249 Y | 9/2005 |
| CN | 2728006 Y | 9/2005 |
| CN | 2821921 Y | 9/2006 |
| CN | 201029143 Y | 2/2008 |
| CN | 201078847 Y | 6/2008 |
| CN | 201107821 Y | 8/2008 |
| CN | 201178194 | 1/2009 |
| CN | 201230066 Y | 4/2009 |
| CN | 101573840 A | 11/2009 |
| CN | 201387960 Y | 1/2010 |
| CN | 201430237 Y | 3/2010 |
| CN | 201498627 U | 6/2010 |
| CN | 201708399 U | 1/2011 |
| CN | 201717435 U | 1/2011 |
| CN | 201741935 U | 2/2011 |
| CN | 201741937 U | 2/2011 |
| CN | 201868687 U | 6/2011 |
| CN | 201966346 U | 9/2011 |
| CN | 102280732 B | 12/2011 |
| CN | 202076514 U | 12/2011 |
| CN | 102437482 A | 5/2012 |
| CN | 102456967 A | 5/2012 |
| CN | 103107439 A | 5/2012 |
| CN | 202217831 U | 5/2012 |
| CN | 202282514 U | 6/2012 |
| CN | 102544812 A | 7/2012 |
| CN | 102655293 A | 9/2012 |

(56) References Cited

FOREIGN PATENT DOCUMENTS

| | | |
|---|---|---|
| CN | 202423735 | 9/2012 |
| CN | 202513384 U | 10/2012 |
| CN | 202737282 | 2/2013 |
| CN | 202856089 U | 4/2013 |
| CN | 103081253 A | 5/2013 |
| CN | 203242848 U | 10/2013 |
| CN | 103401087 A | 11/2013 |
| CN | 103427263 A | 12/2013 |
| CN | 203326282 U | 12/2013 |
| CN | 103515790 A | 1/2014 |
| CN | 103647172 A | 3/2014 |
| CN | 203481540 U | 3/2014 |
| CN | 103762479 A | 4/2014 |
| CN | 203521683 | 4/2014 |
| CN | 203521683 U | 4/2014 |
| CN | 104377509 A | 2/2015 |
| CN | 204243365 U | 4/2015 |
| CN | 204577669 U | 8/2015 |
| TW | 371520 | 10/1999 |
| TW | 452247 | 8/2001 |
| TW | M266600 | 6/2005 |
| TW | M288035 | 2/2006 |
| TW | M299952 | 10/2006 |
| TW | M357077 | 5/2009 |
| TW | M386661 | 8/2010 |
| TW | M387401 | 8/2010 |
| TW | M391213 | 10/2010 |
| TW | M398256 | 2/2011 |
| TW | M398262 | 2/2011 |
| TW | I427870 | 6/2011 |
| TW | M414692 | 10/2011 |
| TW | M426911 | 4/2012 |
| TW | M443957 | 12/2012 |
| TW | M453995 | 5/2013 |
| TW | M454654 | 6/2013 |
| TW | 201328064 A | 7/2013 |
| TW | M471688 | 2/2014 |
| TW | M475728 | 4/2014 |
| WO | WO2009147791 | 12/2009 |
| WO | WO2013/020359 | 2/2013 |

OTHER PUBLICATIONS

USB Type-C Specification 0.9c05-20140518, p. 24-44,47,53-64,84-86.

Universal Serial Bus Type-C Cable and Connector Specification Revision 1.0 Aug. 11, 2014, p. 18-19,28-48,51,55,58,59-63,65-67,70,93,96-99.107,110-113.

* cited by examiner ent apparent from the following detailed description when taken in conjunction with the accompanying drawings.

FLIPPABLE ELECTRICAL CONNECTOR

CROSS REFERENCE TO RELATED APPLICATIONS

This application is a continuation of a co-pending application Ser. No. 15/161,306, filed Mar. 23, 2015, which is a continuation-in-part of the co-pending application Ser. No. 14/497,205 filed Sep. 25, 2014 and Ser. No. 14/558,732 filed Dec. 3, 2014 and further claims the benefit of and priority to, U.S. Provisional Patent Application No. 61/969,823, filed Mar. 24, 2014, the contents of which are incorporated entirely herein by reference.

BACKGROUND OF THE INVENTION

1. Field of the Invention

The present invention relates to an electrical connector, and more particularly to a flippable plug connector used with a receptacle connector.

2. Description of Related Art

In the previously filed provisional applications, the plug connector is "flippable" whereas we turn the plug over and it functions the same top and bottom. In order to be able to handle switching of the super speed signaling, a MUX (or SS switch) is built into the silicon. This can be costly and also cause some additional degredation in the super speed signals. Recently, a proposal for use with the future USB (Universal Serial Bus) was presented.

Hence, a new and simple electrical plug connector and the complementary receptacle connector are desired to improve those disclosed in the aforementioned proposal.

SUMMARY OF THE INVENTION

Accordingly, the object of the present invention is to provide a receptacle connector for use with a plug, includes an insulative housing defining a base and a mating tongue extending, with a widen and thicken step portion defined at a root region of the mating tongue; a plurality of contacts disposed in the housing with contacting sections exposed upon the first and second surfaces of the mating tongue and categorized with signal contacts, power contacts and grounding contacts. Each of first and second surfaces of the step portion is fitly surrounded with a metallic plate, the metallic plate mechanically and electrically connects to the corresponding grounding contact.

The receptacle connector for mating with a plug connector, comprising: an insulative housing including a base and a mating tongue extending forwardly therefrom, with a widen and thicken step structure formed upon a root region of the mating tongue; a metallic shell enclosing said housing to define a mating cavity in which said mating tongue extends; a plurality of contacts disposed in the housing with corresponding contacting sections exposed upon a first surface and a second surface of the mating tongue, said contacts being categorized with signal contacts, power contacts and grounding contacts; a shielding plate embedded with the mating tongue and forming a pair of notches in two opposite lateral side edges as a locking device; wherein the shielding plate defines a pair of protrusions unitarily bulged downwardly therefrom to replace and function as corresponding grounding contacting section for corresponding grounding contacts to be exposed on the second surface of the mating tongue.

Other objects, advantages and novel features of the invention will become more apparent from the following detailed description when taken in conjunction with the accompanying drawings.

BRIEF DESCRIPTION OF THE DRAWINGS

FIG. 14 (A) is a cross-sectional view of another embodiment of the mated plug connector and receptacle connector of FIG. 1 to show how the latch of the plug connector is lockable engaged with the shielding plate of the receptacle connector wherein the shielding plate has lateral extensions to mechanically and electrically connected to the collar and the shield optionally.

DETAILED DESCRIPTION OF THE PREFERRED EMBODIMENT

Reference will now be made in detail to the preferred embodiment of the present invention.

Figure 1:
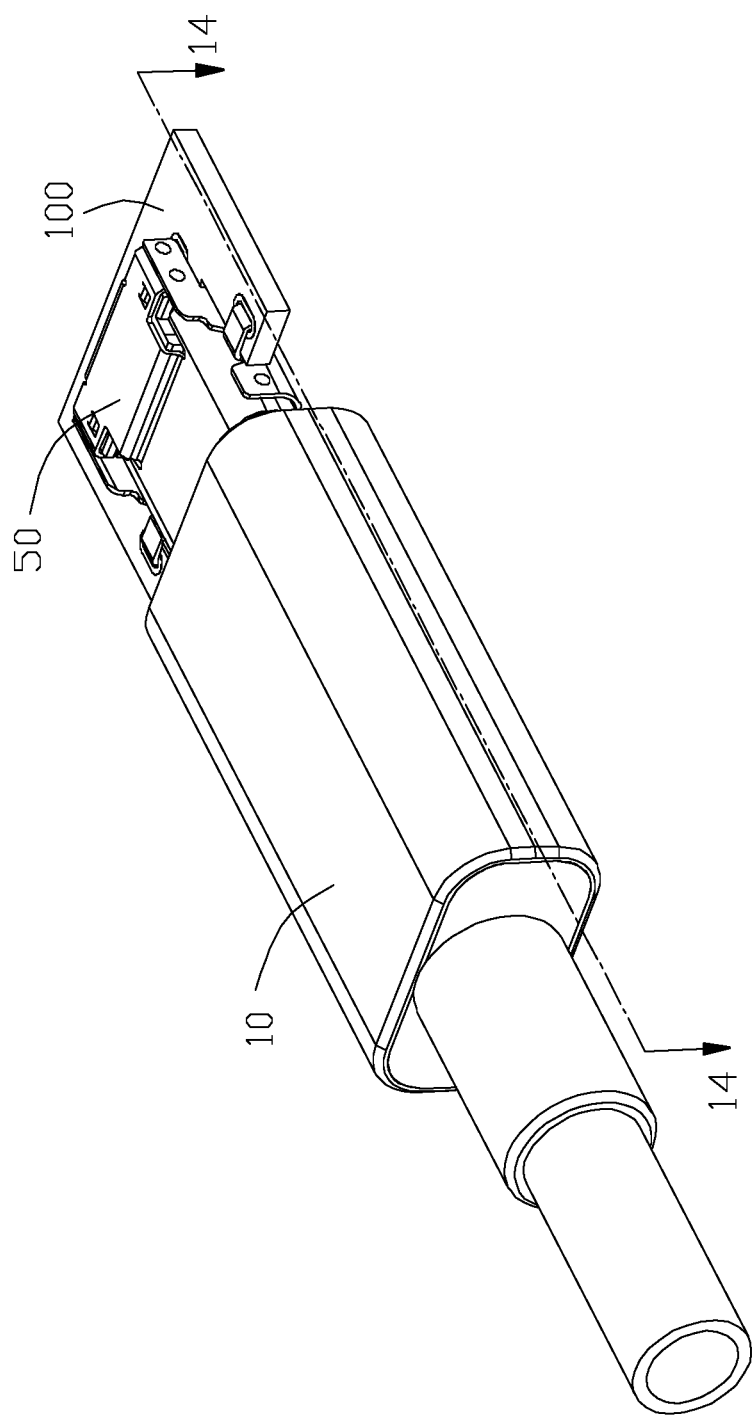
FIG. 1 is an assembled perspective view of a mated receptacle connector on the printed circuit board and a plug connector of a first embodiment of the instant invention.
Figure 2:
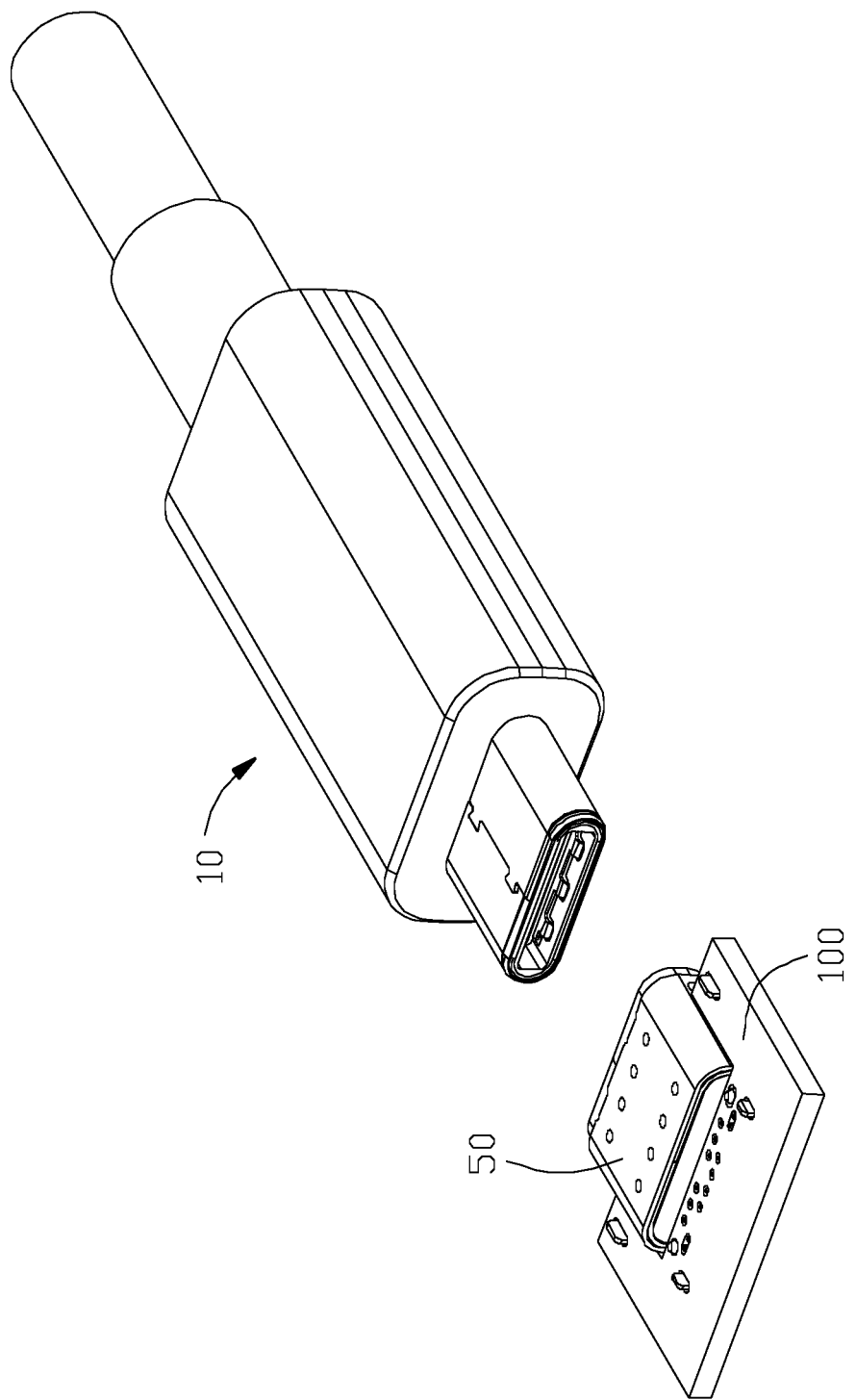
FIG. 2 is a rear exploded perspective view of the receptacle connector and the plug connector of FIG. 1.

FIGS. 1-2(B) show a plug connector 10 mated with a receptacle connector 50 mounted in a notch 102 of a printed circuit board. 100, of a first embodiment of this present invention. Referring to FIGS. 3-9 showing the receptacle connector 50, the receptacle connector 50 includes an insulative housing 52 with a mating tongue 54 forwardly extending in a capsular mating cavity 57 of a metallic shield 56 which encloses the housing 52. Opposite upper and lower rows of contacts 58 are disposed in the housing 52 with corresponding contacting sections 60 exposed upon opposite surfaces of the mating tongue 54 in a diagonally symmetrical arrangement mechanically and electrically so as to allow a so-called flappable insertion of the plug connector 10 thereinto. A step structure 62 is formed around a root of the mating tongue 54. A one piece metallic EMI collar 64 includes a loop structure 66 intimately surrounding the step structure 62.

The housing 52 is composed of the upper piece 70 and a lower piece 72 commonly sandwiching therebetween a middle piece 74 which forms the mating tongue 54. The upper row contacts 58 are associated with the upper piece 70, the lower row contacts 58 associated with a lower piece 72 and the shielding plate 76 is associated with the middle piece 74 via an insert molding process wherein the contacting sections 60 of the upper row contacts 58 and those of the lower rows contacts 58 are seated upon opposite upper surface and lower surface of the mating tongue 54, respectively, as mentioned before. A rear portion of the step structure 62 is removed to have a front edge region 71 of the upper piece 70 and the front edge region 73 of the lower piece 72 sandwiched between the middle piece 74 and the loop structure 66 of the EMI collar 64 so as to enhance the strength during mating under some bending. In this embodiment, the shielding plate 76 defines an opening 77 and a thinner area 78 for both securing and impedance consideration, and further a pair of mounting legs 79 so as to efficiently separate the upper row contacts 58 and the lower row contacts 58 from each other wherein the upper row contacts 58 form the surface mount type tail sections while the lower row contacts 58 form the through hole type tail sections. The lower piece 72 includes a pair of mounting posts 80 receiving in the corresponding through hole for mounting the housing 52 to the printed circuit board 100.

In this embodiment, the middle piece 74 forms a pair of recesses 82 to respectively receive the corresponding protrusions 84 of the upper piece 70 and the lower piece 72 for securing the upper piece 70, the lower piece 72 and the middle piece 74 therebetween in a stacked manner wherein the upper piece 70 further include a pair of downward assembling poles 84 received in the corresponding alignment holes 86 of the middle piece 74, and the lower piece 72 further includes an upward assembling pole 85 received in the corresponding alignment holes 86 of the middle piece 74, and the lower piece 72 further forms a pair of upward locating posts 87 received within the corresponding recesses 89 in the upper piece 70. In this embodiment, the lower piece 72 defines a plurality of through holes 91 and 93 to receive the tail sections of the lower row contacts 58 and the mounting legs 79 of the shielding plate 76 to extend therethough as an alignment spacer. Notably, the shielding plate 76 forms a front edge section 69 extending forwardly beyond a front edge of the mating tongue 54 for anti-mismating consideration, and a pair of lateral edge sections 67 for locking with a latch 39 of the plug connector 10 (illustrated later). In brief, the shielding plate 76 is essentially multifunctional to perform shielding, grounding, reinforcing, anti-mis-mating and locking. A metallic bracket 95 is soldered under the shield 56 and forms a pair of supporting legs 97 mounted into the through hole 103 of the printed circuit board 100 for supporting the receptacle connector 50 within the notch 102 of the printed circuit board 100. The shield 56 further includes a pair of mounting legs 55 received in the through holes 104 for mounting to the printed circuit board 100 and a pair of locking tabs 59 received in the recesses 99 of the upper piece 70 after the shield 56 is rearwardly assembled to the housing 52 in a front-to-back direction. Notably, the mounting leg 79 of the shielding plate 76 share the same through hole with the neighboring grounding contact tail for enhancing grounding effect.

Figure 14:
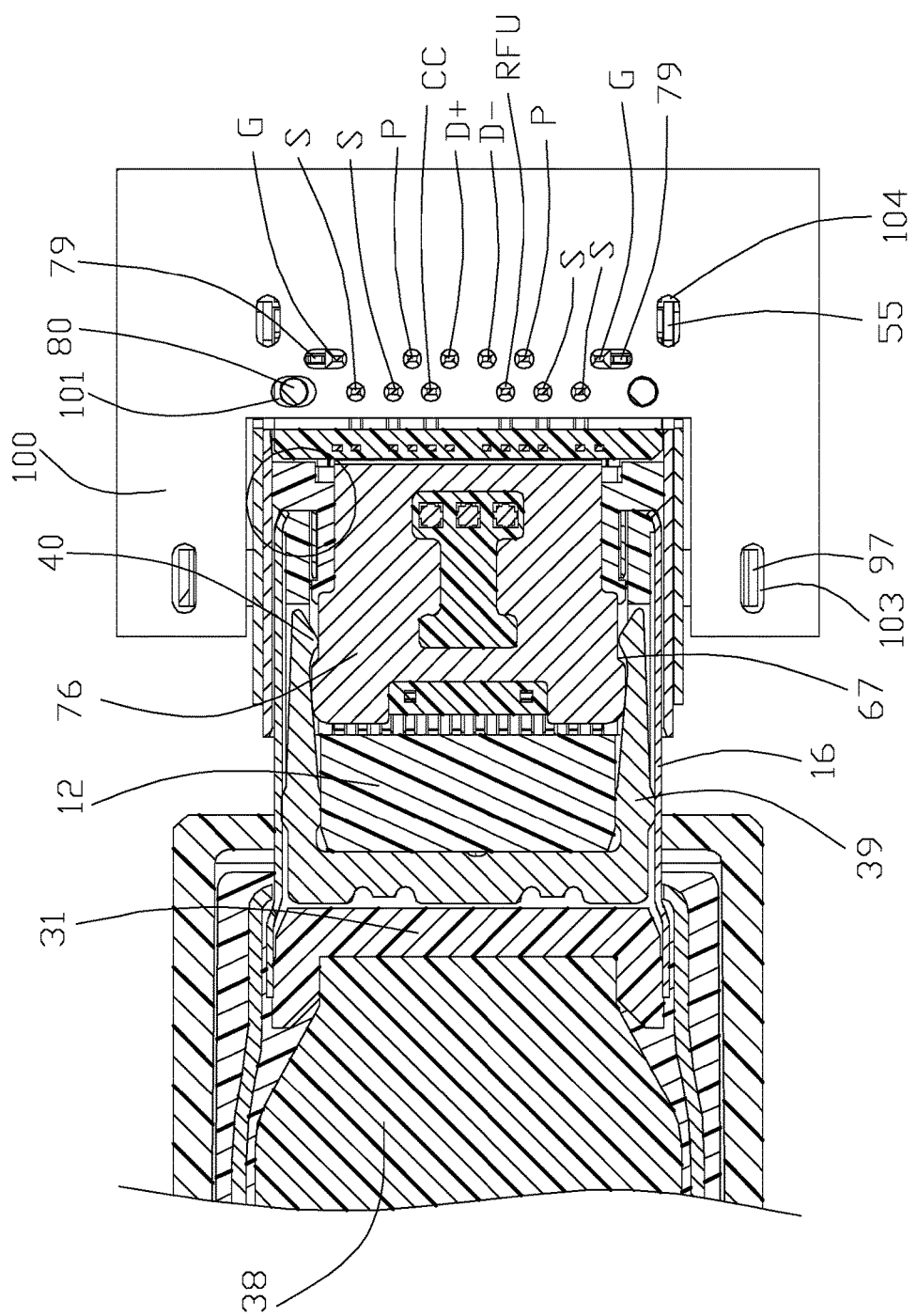
FIG. 14 is a cross-sectional view of the mated plug connector and receptacle connector of FIG. 1 to show how the latch of the plug connector is lockable engaged with the shielding plate of the receptacle connector.

Referring to FIGS. 10-13(B) and further FIG. 14, the plug connector 10 includes an insulative housing 12 having a capsular front contour with a rectangular receiving cavity 14 therein and enclosed in a metallic shell 16. Opposite upper and lower rows of contacts 18 are disposed in the corresponding passageways 32 of the housing with corresponding contacting sections 20 extending into the receiving cavity 14 wherein the upper and lower rows of contacts 18 are diagonally symmetrically arranged with each other in both electrical and mechanical arrangement so as to meet the so-called flappable mating, i.e., the dual opposite orientations. A pair of upper and lower EMI (Electro-Magnetic Interference) spring plates 22 are enclosed in the shell 16, and each of the EMI spring plates 22 is sandwiched between the shell 16 and the housing 12 and includes a front resilient region 24 extending inwardly toward the receiving cavity 14 and in front of the contacting sections 20, a rear abutting region 26 to abut against the shell 16, and a pair of side retention regions 28 retainably engaged within corresponding side portions of the housing 12. A pair of tapes 30 are disposed upon two opposite sides of the housing 12 so as to isolate the contacting section 20 from the shell 16. A spacer 34 is located behind the housing and defines a plurality of passages 35 through which the tail sections 21 of the contacts 18 rearwardly extend. A recessed region 36 is formed in a rear face of the spacer 34 to receive a front edge region of a paddle card 38 wherein the tail sections 21 of the contacts 18 extending through the corresponding passages 35, are soldered upon the corresponding pads 37. The spacer 34 forms a forward extending blade 31 with a pair of forward protrusions 33 on two faces in the vertical direction to be commonly inserted into a back side of the housing 12 wherein the blade 31 is essentially received in the side slots 13 of the housing 12. A U-shaped metallic latch 39 of a blanking type received in the side slots 13 of the housing 12 with a pair of locking heads 40 extending into the two opposite lateral sides of the receiving cavity 14 to lock with the lateral edge sections 67 of the shielding plate 76 of the receptacle connector 50 during mating. Understandably, the latch 39 is restrained by the blade 31, the forward protrusions 33, the slots 13 and an interior rear face of the housing 12.

Figure 14A:
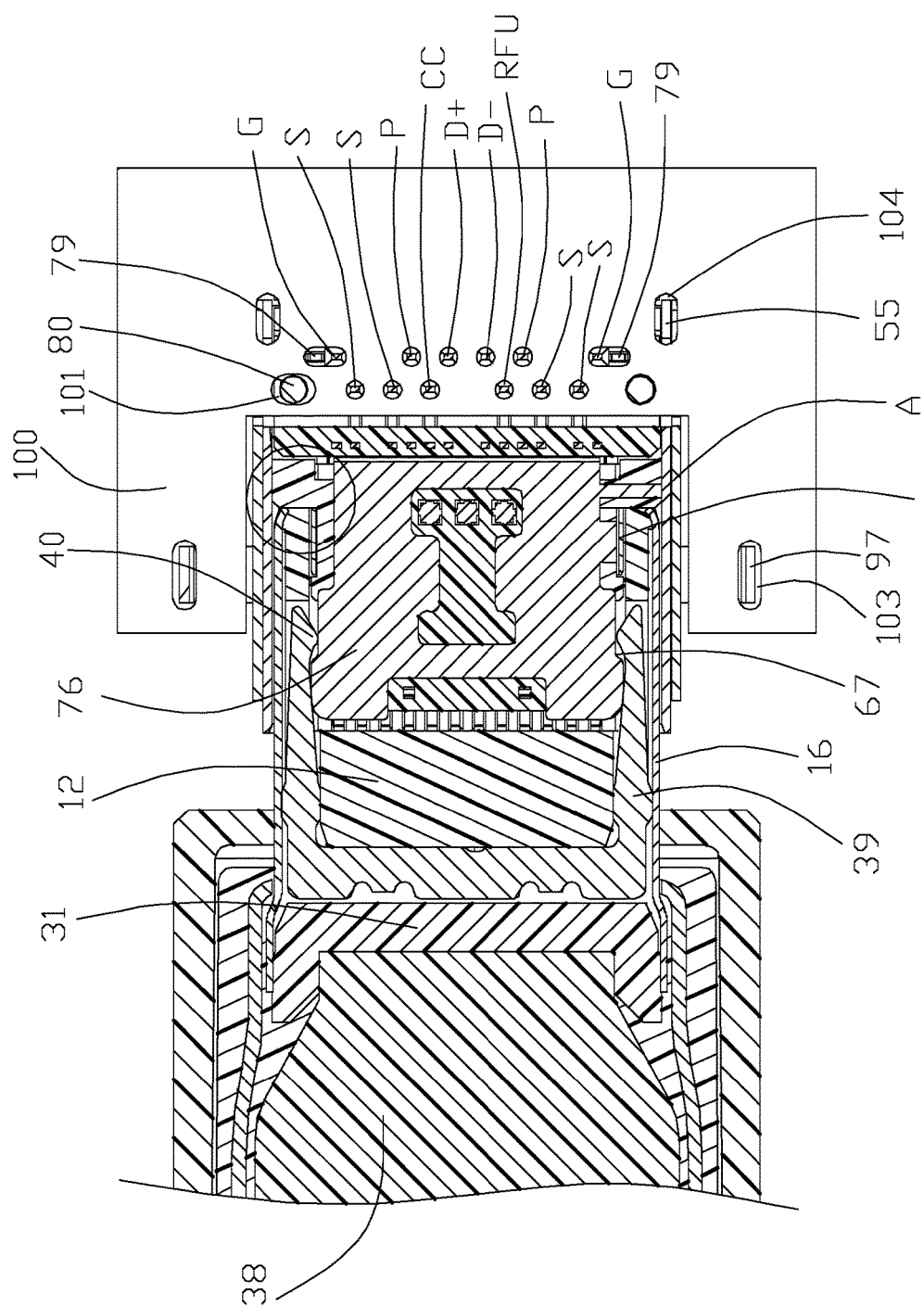

A cable 41 behind the paddle card 38, encloses a plurality of wires 42 regulated by a pair of organizer 43 to be soldered upon a rear region of the paddle card 38. An auxiliary rear shell 17 grasps the shell 16 to shield the paddle card 38, and a clipper 44 grasps the cable 41 behind the paddle card 38. Opposite front overcoat 45 and rear overcoat or strain relief 46 are overmolded upon the rear shell 17 and the clipper 44, respectively. Finally, a cover 47 essentially fully covers the clipper 44, the front overcoat 45 and the rear overcoat 46. During mating, the mating tongue 54 is received in the receiving cavity 14 with the corresponding contacting sections 60 of the contacts 58 of the receptacle connector 50 connected to the contacting sections 20 of the contacts 18 of the plug connector 10 wherein the latch 39 is locked with the shielding plate 76, and the front resilient region 24 of the spring plate 22 contacts the collar 64. It is noted that in FIG. 14(A) in an alternate embodiment, the latch 39 laterally contacts the shell 16 to establish grounding, and the shielding plate 76 may optionally laterally extend to contact the EMI collar 64 at B or the shield 56 at A to establish additional grounding thereof other than the mounting leg 79. Alternately, the shielding plate may be equipped with a pair of opposite resilient side fingers, at the rear side, respectively contacting the shield.

Figure 3:
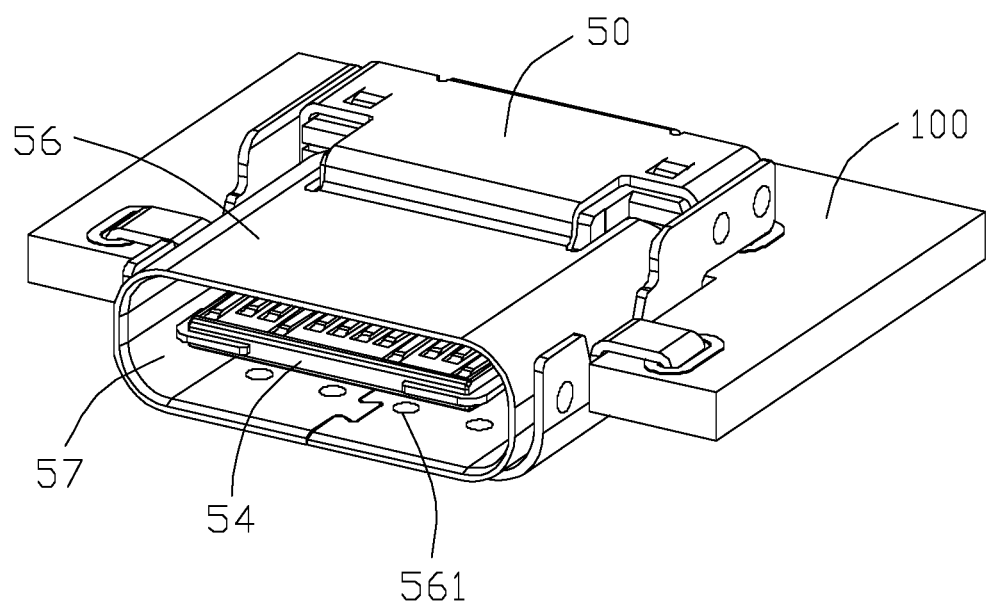
FIG. 3 is a front perspective view of the receptacle connector on the printed circuit board of FIG. 1.
Figure 4:
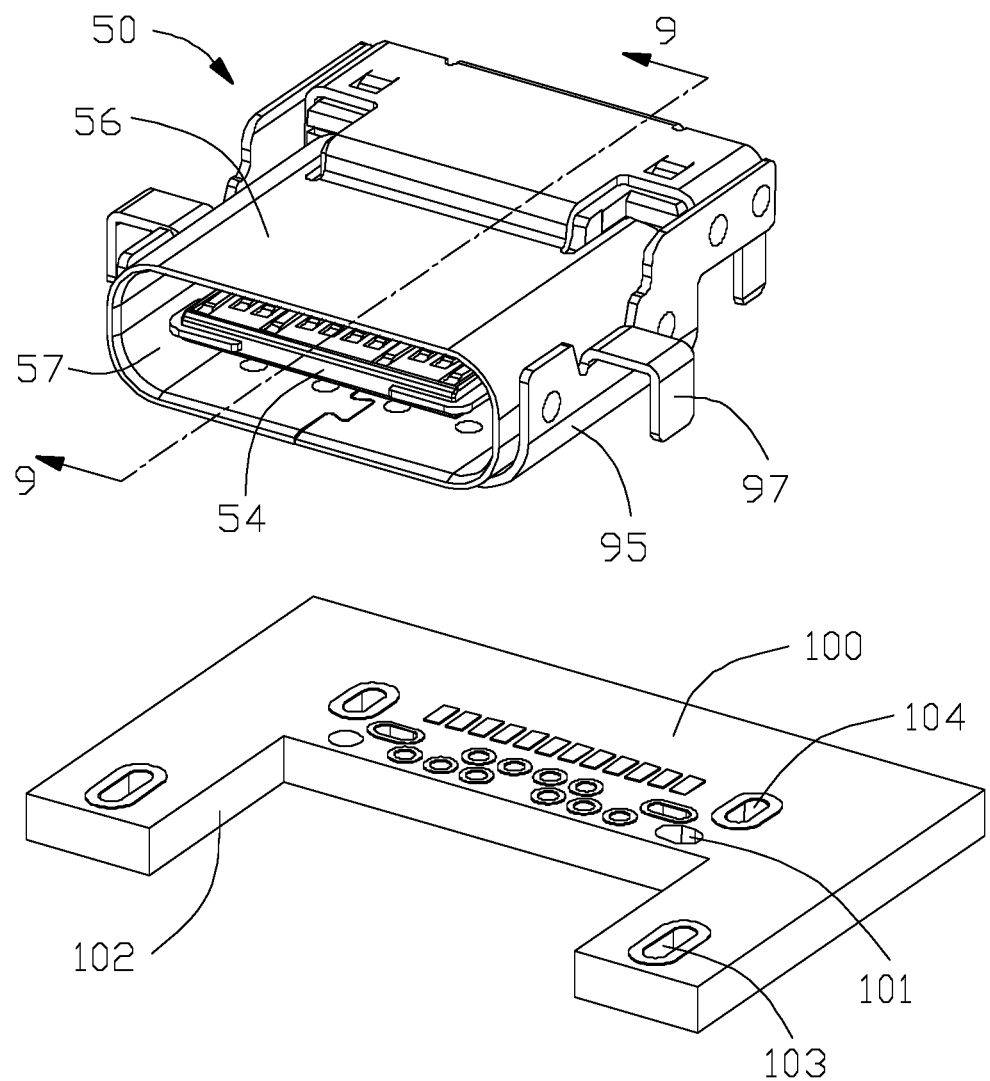
FIG. 4 is a front perspective view of the receptacle connector spaced from the printed circuit board of FIG. 1.
Figure 5A:
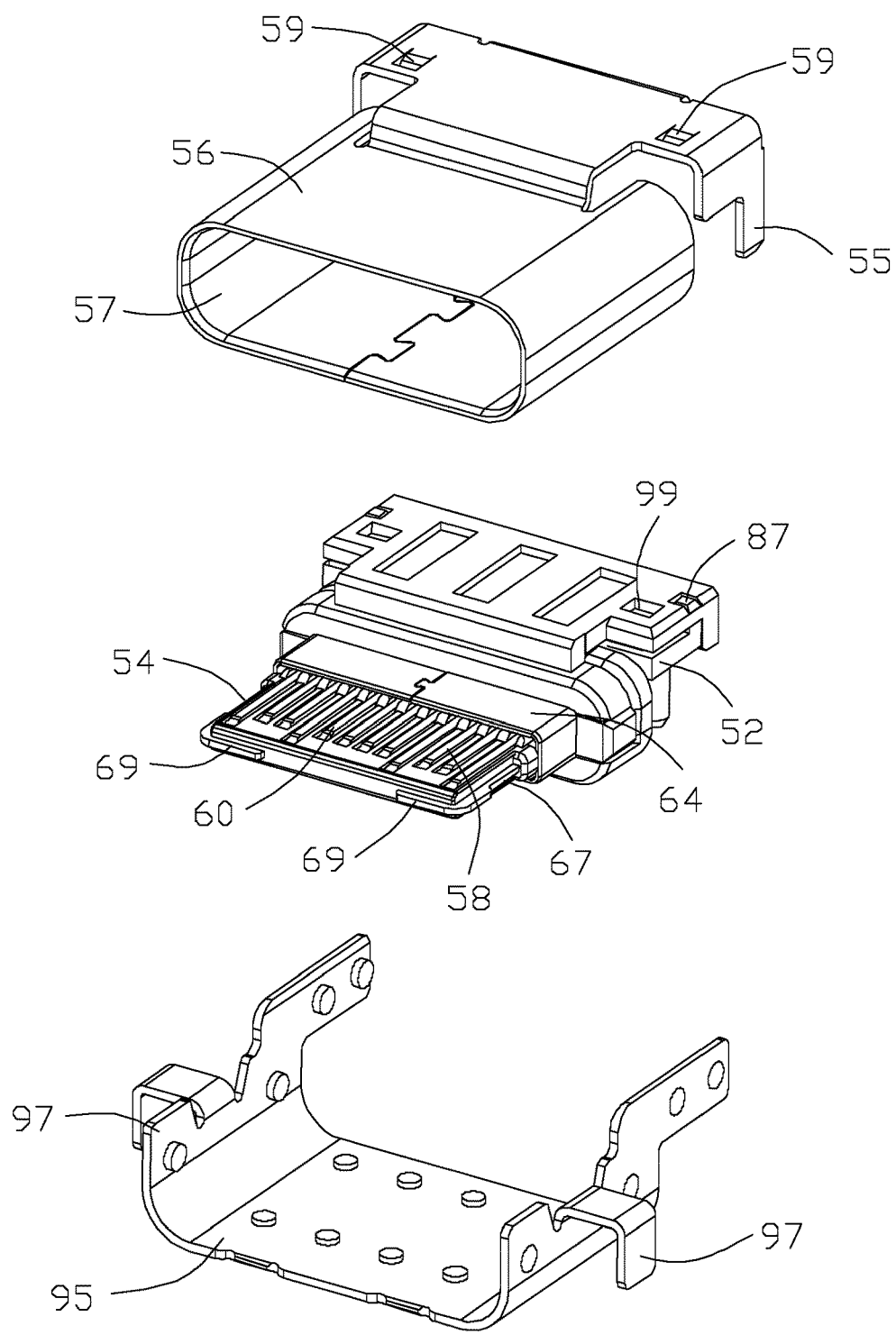
FIG. 5(A) is a front partially exploded perspective view of the receptacle connector of FIG. 4.
Figure 5B:
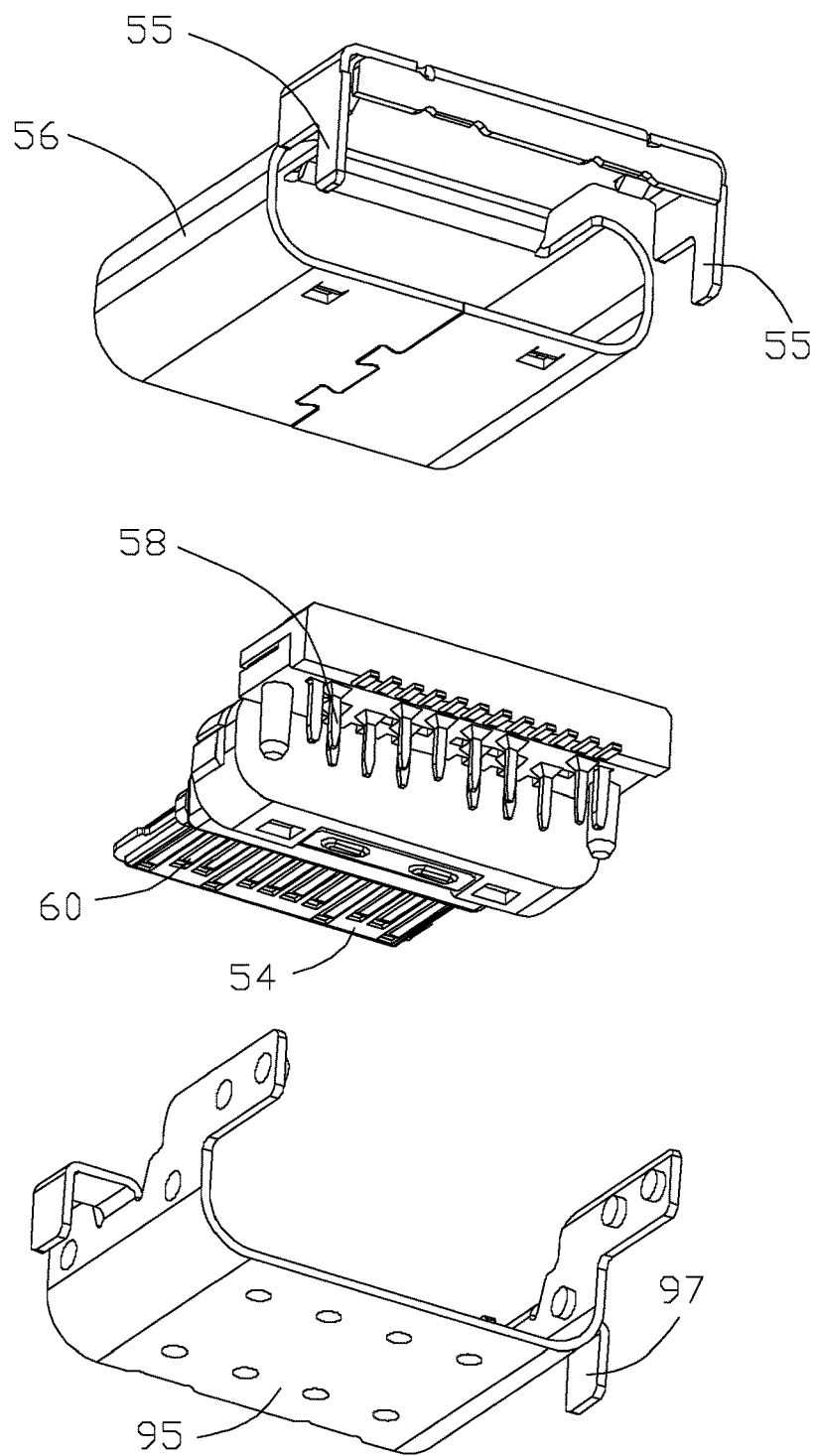
FIG. 5(B) is a rear partially exploded perspective view of the receptacle connector of FIG. 4.
Figure 6:
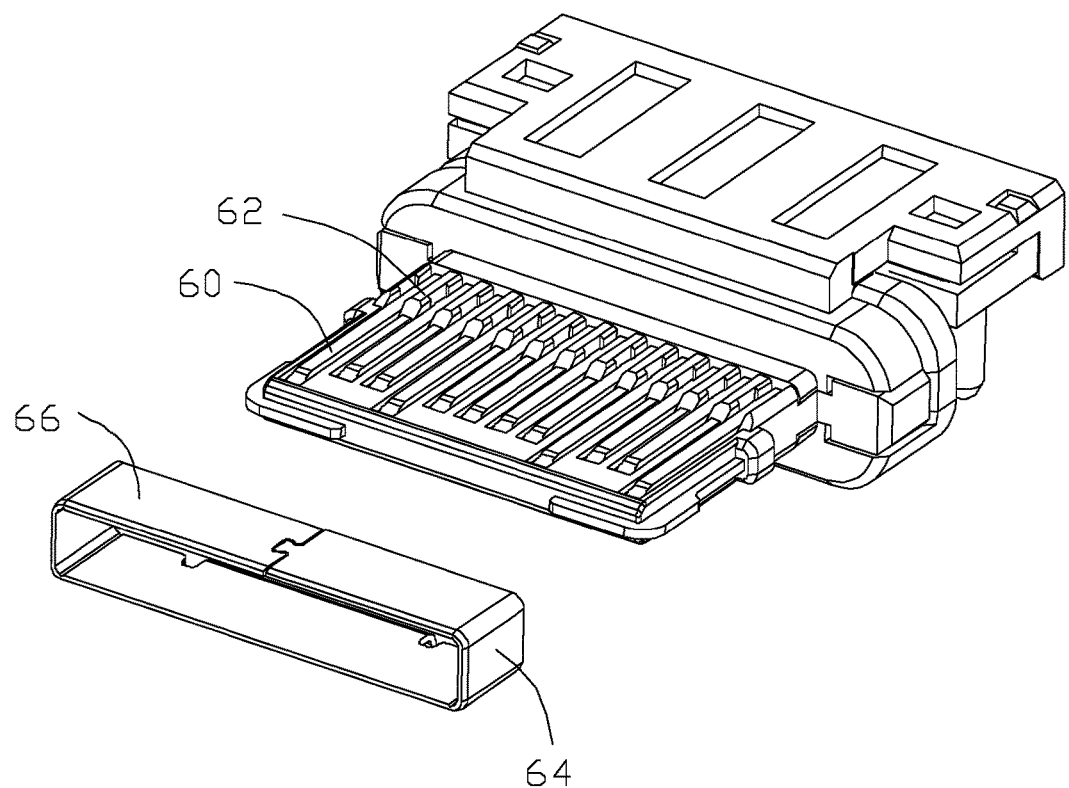
FIG. 6 is a front partially exploded perspective view of the receptacle connector of FIG. 4 without the shield thereof.
Figure 7A:
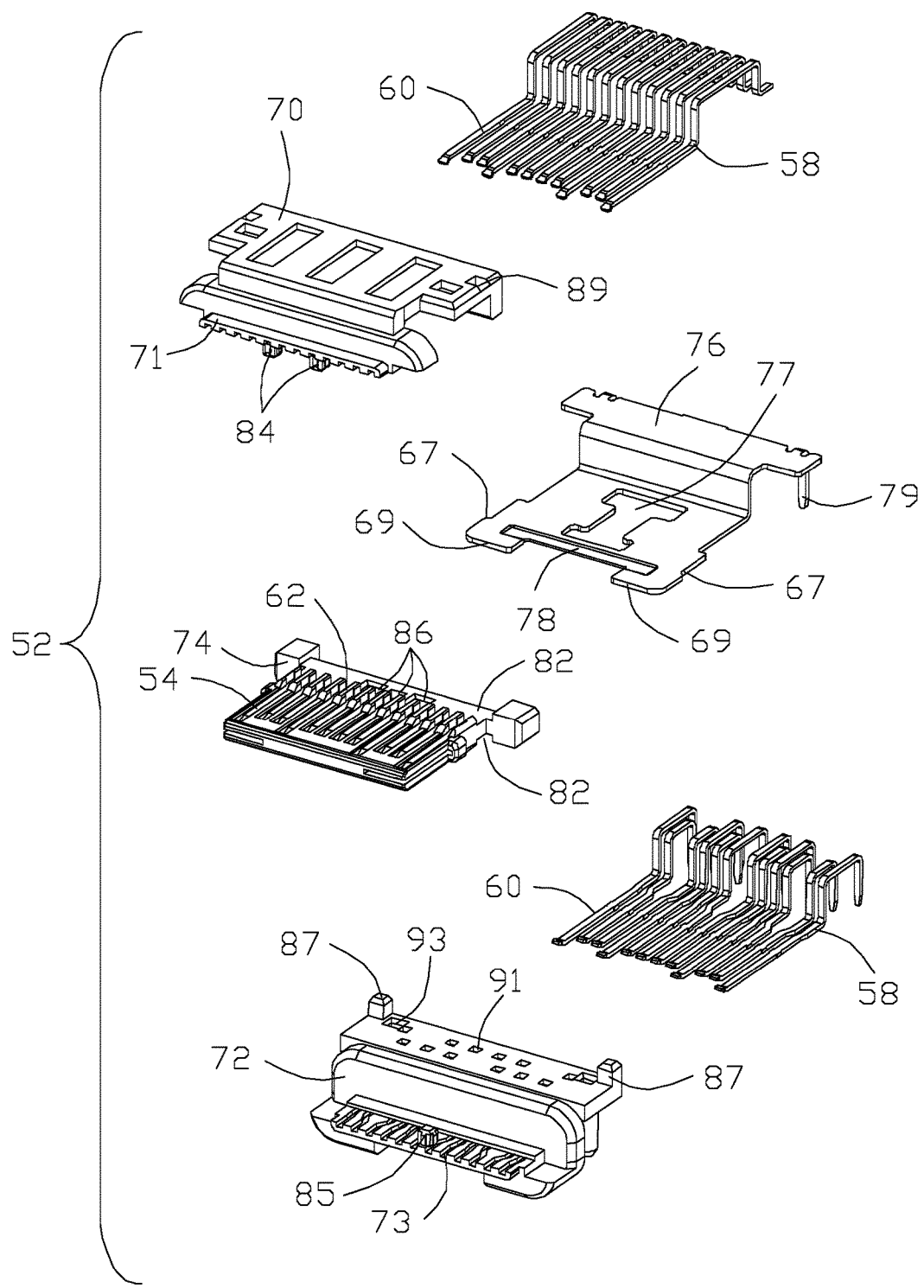
FIG. 7(A) is a front partially exploded perspective view of the receptacle connector of FIG. 4 to show the housing and the contacts thereof.
Figure 7B:
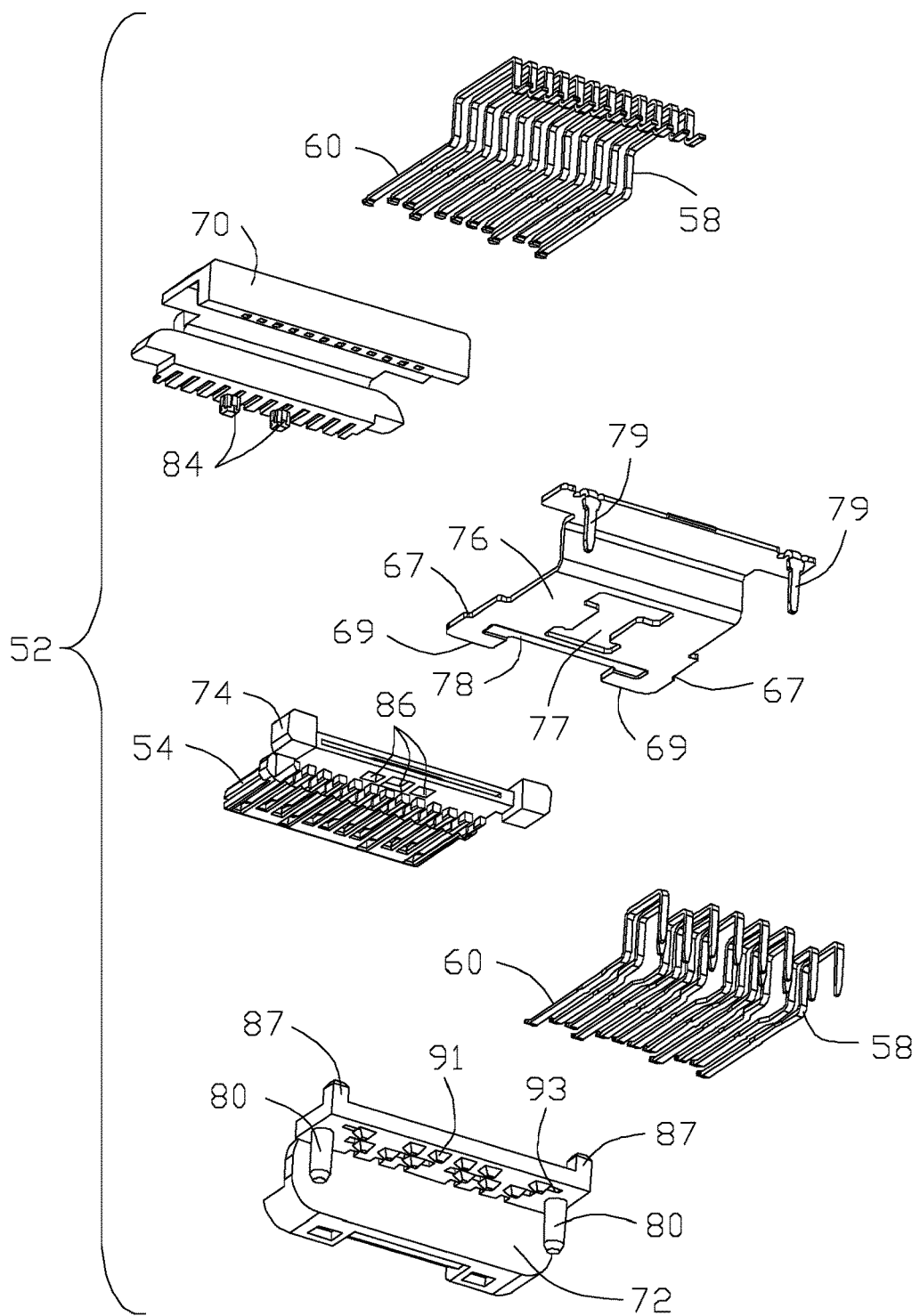
FIG. 7(B) is a rear partially exploded perspective view of the receptacle connector of FIG. 4 to show the housing and the contacts thereof.
Figure 8A:
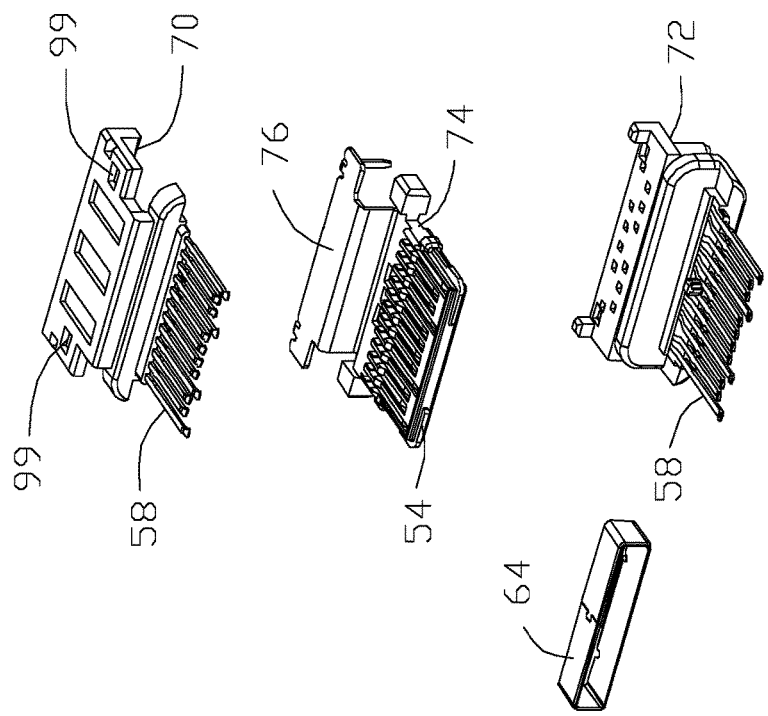
FIG. 8(A) is a front partially exploded perspective view of the receptacle connector of FIG. 4 wherein the housing and the contacts are pre-assembled together.
Figure 8A:
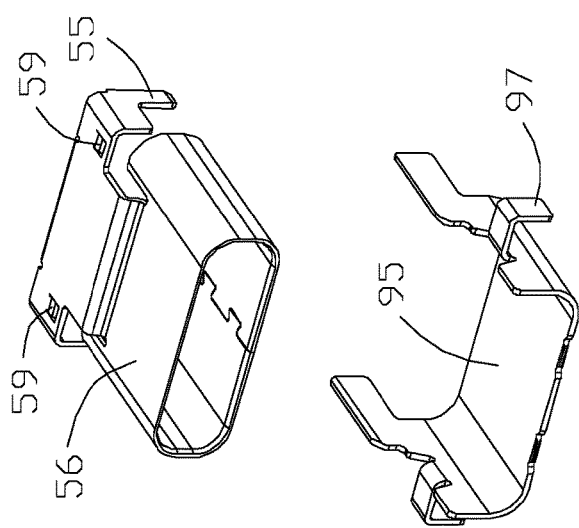
Figure 8B:
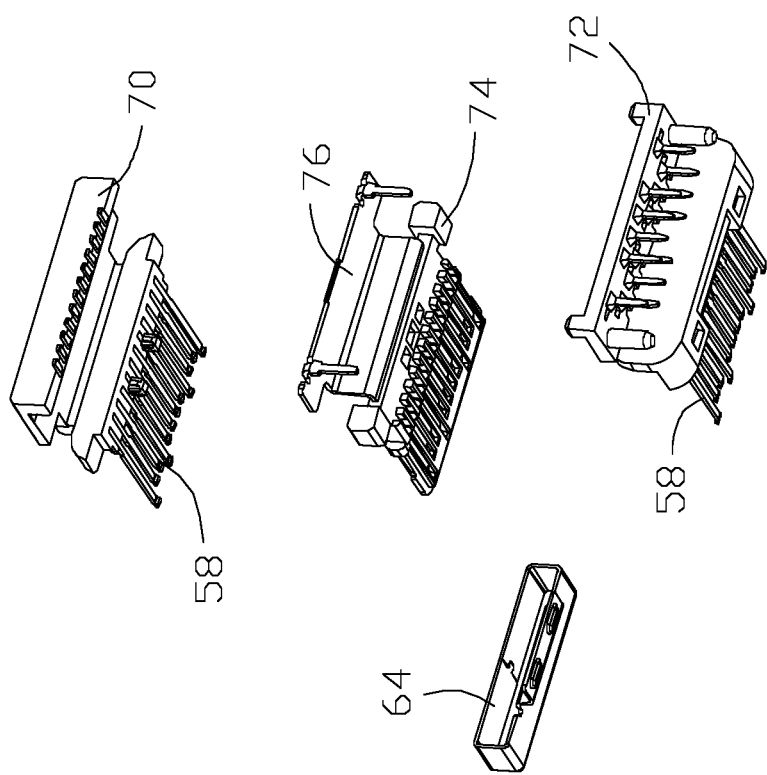
FIG. 8(B) is a rear partially exploded perspective view of the receptacle connector of FIG. 4 wherein the housing and the contacts are pre-assembled together.
Figure 8B:
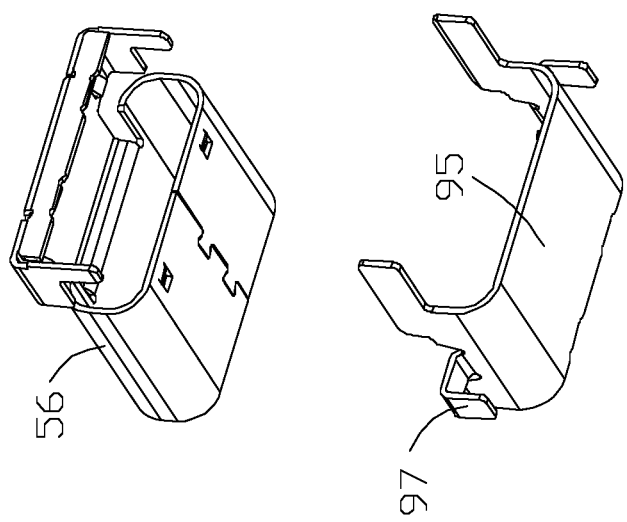
Figure 9:
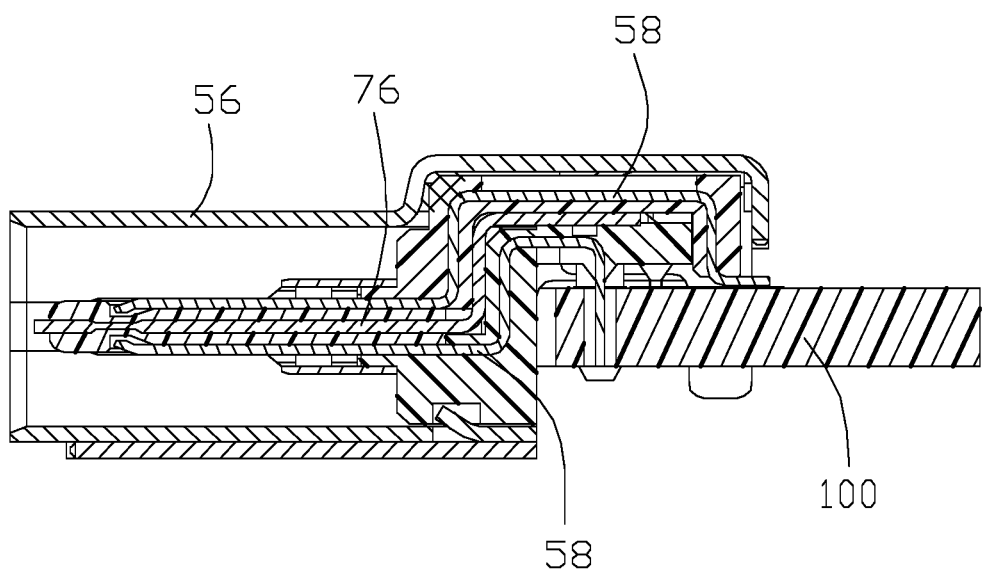
FIG. 9 is a cross-sectional view of the receptacle connector on the printed circuit board of FIG. 4.
Figure 10:
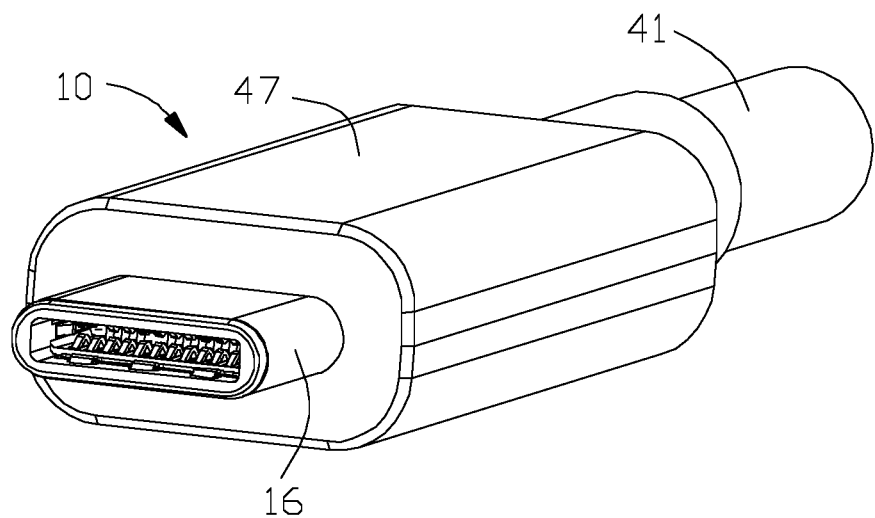
FIG. 10 is a front assembled perspective view of the plug connector of FIG. 1.
Figure 11A:
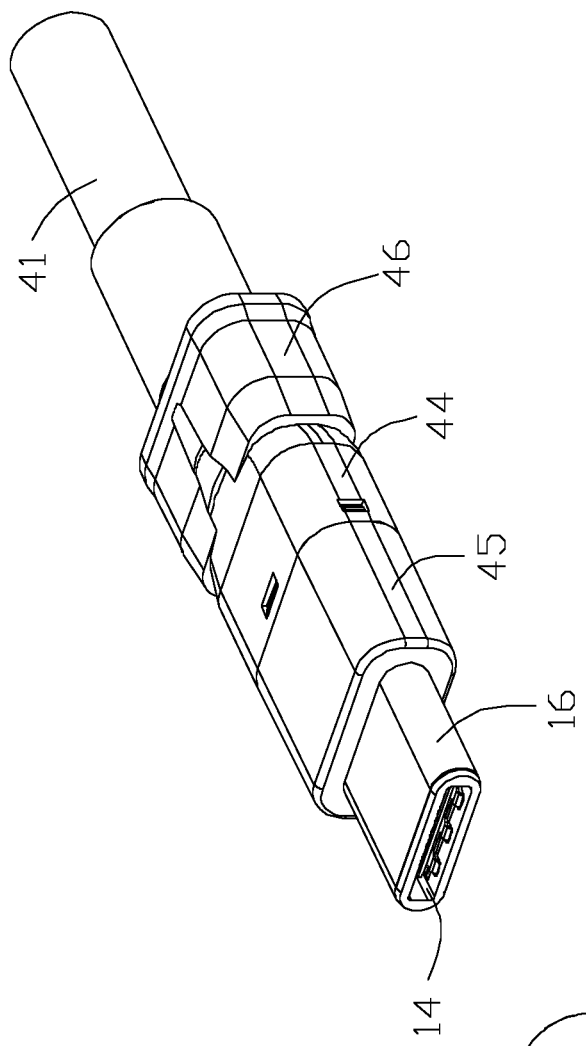
FIG. 11(A) is a front partially exploded perspective view of the plug connector of FIG. 10 wherein the cover is removed away from the remainder.
Figure 11A:
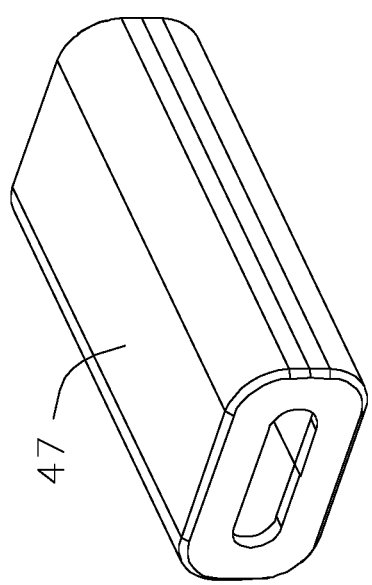
Figure 11B:
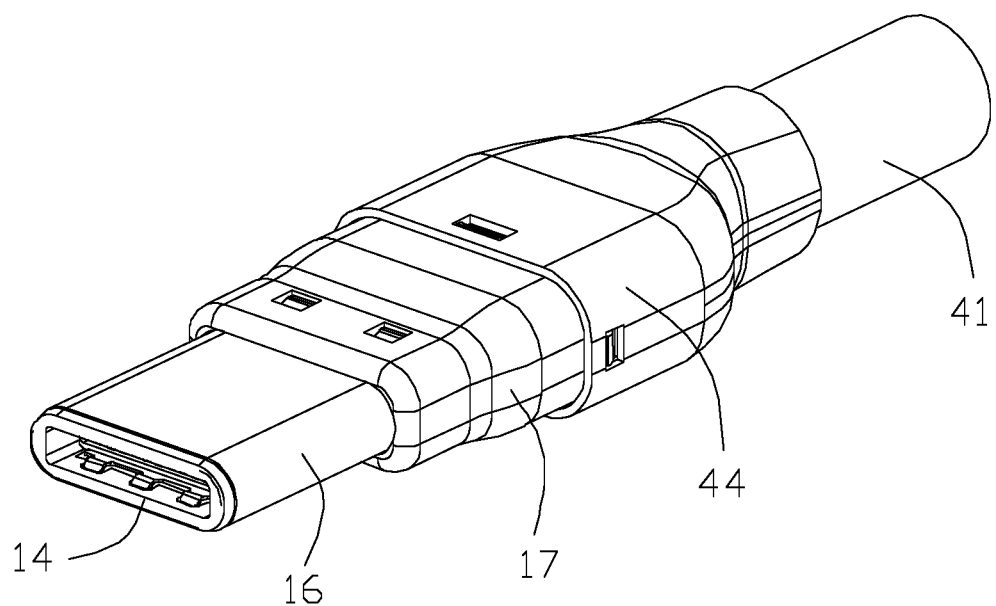
FIG. 11(B) is a front partially exploded perspective view of the plug connector of FIG. 11(A) wherein the front and rear over-moldings have been further removed.
Figure 12A:
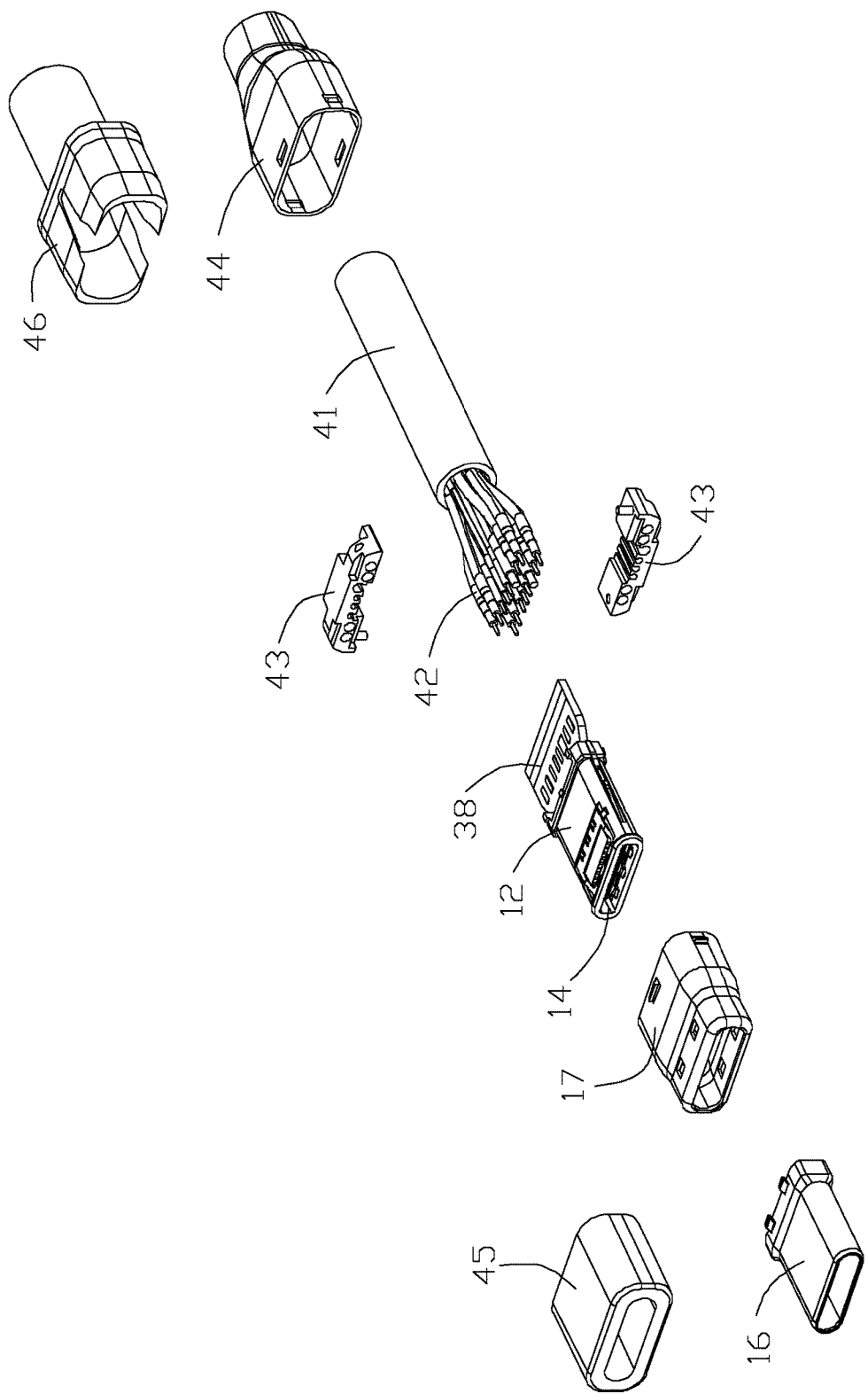
FIG. 12(A) is a front partially exploded perspective view of the plug connector of FIG. 10 without the cover thereof.
Figure 12B:
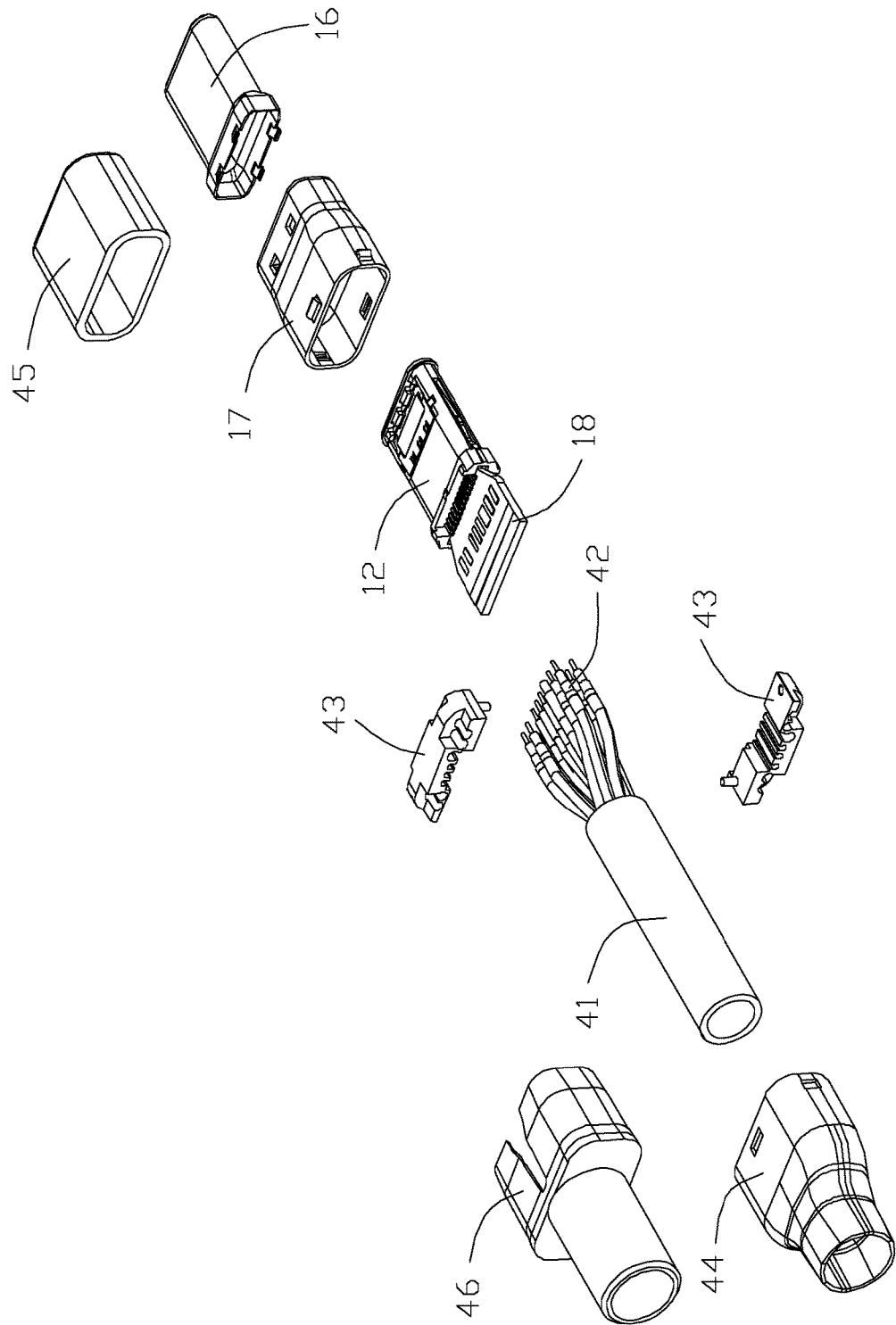
FIG. 12(B) is a rear partially exploded perspective view of the plug connector of FIG. 12(A).
Figure 13A:
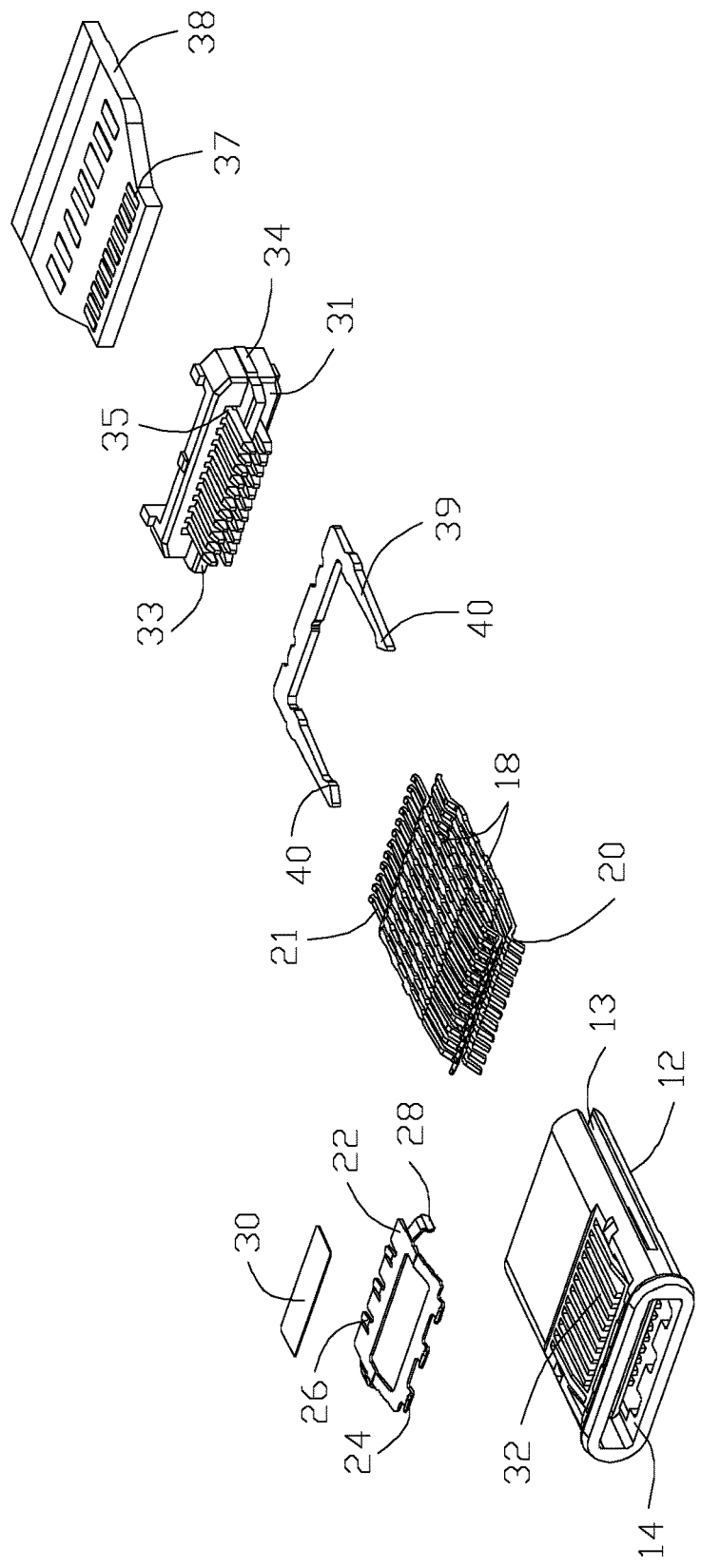
FIG. 13(A) is a front partially exploded perspective view of the plug connector of FIG. 12(A) by removal of additional parts therefrom.
Figure 13B:
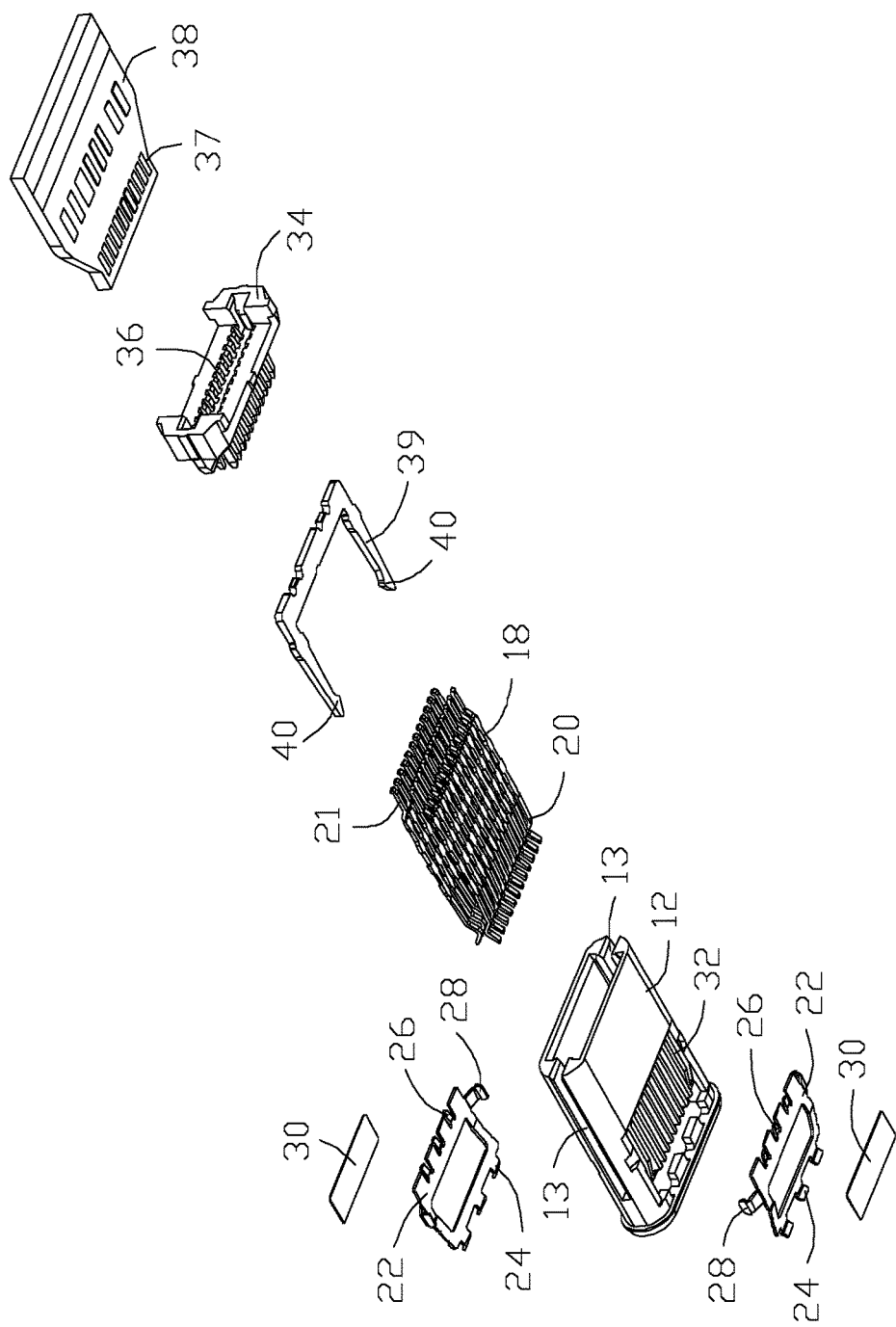
FIG. 13(B) is a rear partially exploded perspective view of the plug connector of FIG. 13(A).

In the first embodiment, the shield 56 of the receptacle connector 50 can be optionally equipped with inward bumps 561 (as shown in FIG. 3) thereon (as shown in Ser. No. 61/926,270) to contact the shell 16 of the plug connector 50 for enhancement of retention between the receptacle connector 50 and the plug connector 10 while still keeping the shield 56 in a complete sealed manner compared with the traditional type having the retaining spring tangs stamped therefrom. Similarly, the bumps may be formed on an exterior surface of the shell 16 of the plug connector 10.

Figure 15:
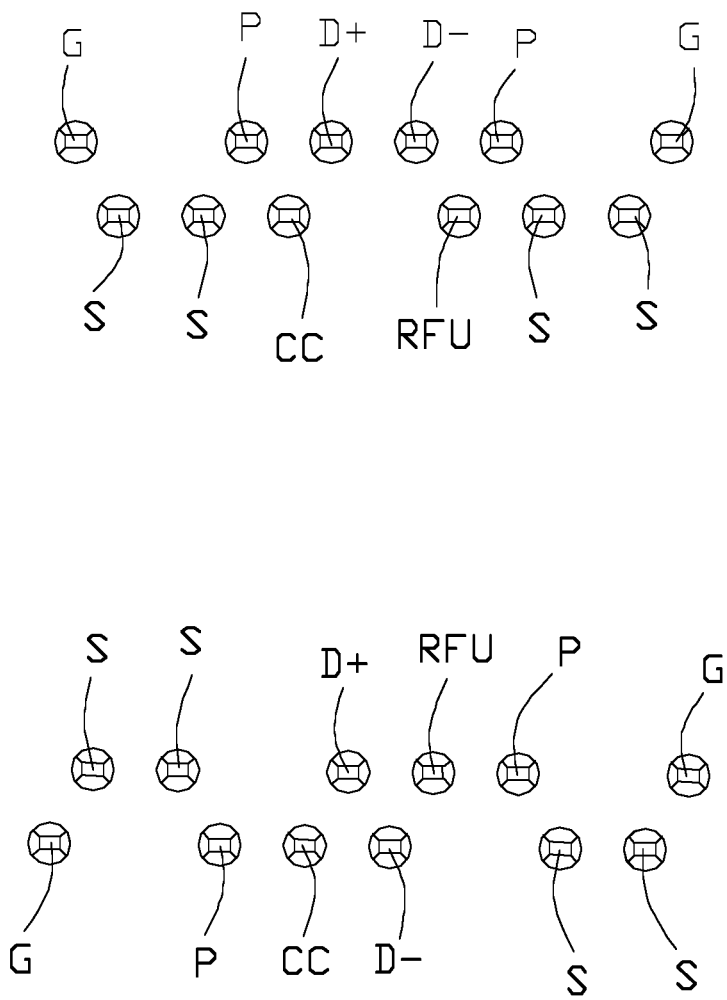
FIG. 15 shows the footprint of the tails of the lower row contacts of the receptacle connector of FIG. 1 on the layout of the printed circuit board wherein the upper figure shows that is disclosed in FIG. 14, while the lower figure shows an variation therewith.

As shown in FIG. 15, it is also noted that the through hole type contact tail of the lower row contacts 58 to intentionally enlarge the distance between the two neighboring tails in the same row so as to compromise the occupying space of the footprint of the tails of the whole row contacts while allowing the tails of the same differential pair signal contacts to be in the same row. Also, in this embodiment, the two pairs of differential signal contacts are arranged commonly in one row and the D+ and D− are commonly locate in another row. Alternately, the footprint of the tails of the lower row contacts 58 may be arranged as shown in FIG. 15 wherein the two differential signal pairs are respectively located in two different rows, and the D+ and D− also are located in two different rows, respectively. Moreover, in the first embodiment the tails of the upper row of contacts are arranged in one row of a surface mount type. Alternately, the tails of the upper row of contacts may be arranged in two rows similar to those of the lower row of contacts, either in a same manner or in a mirror image manner. Under such a situation, the tail of the outermost grounding contact of the lower row of contact and that of the upper row of contact may closely located with each other or even sharing the same through hole in the printed circuit board, or those two grounding contacts may be unified together, or mechanically and electrically linked via a common transverse grounding bar as one piece. To enhance the grounding effect, the tail portion of the corresponding grounding contact may be laterally expanded compared with those of the remaining contacts. It is also noted that for the tails of the lower row of contacts, a tapered configuration of the lower piece is formed around each tail to assuring precise position of the corresponding tail. Alternatively, the shielding plate is equipped with a pair of spring fingers to contact the selected grounding contacts.

Figure 16A:
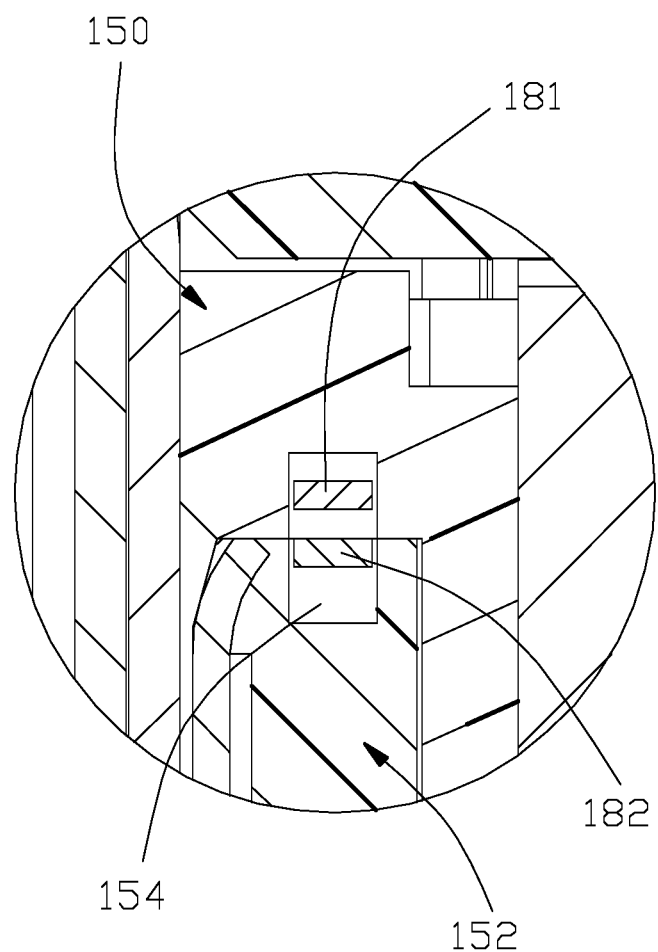
FIG. 16(A) is a cross-sectional view of an alternative embodiment of the receptacle connector equipped with a pair of switch contacts for cooperation with another type connector different from the plug connector of the previous embodiment wherein the switch contacts is not activated.
Figure 16B:
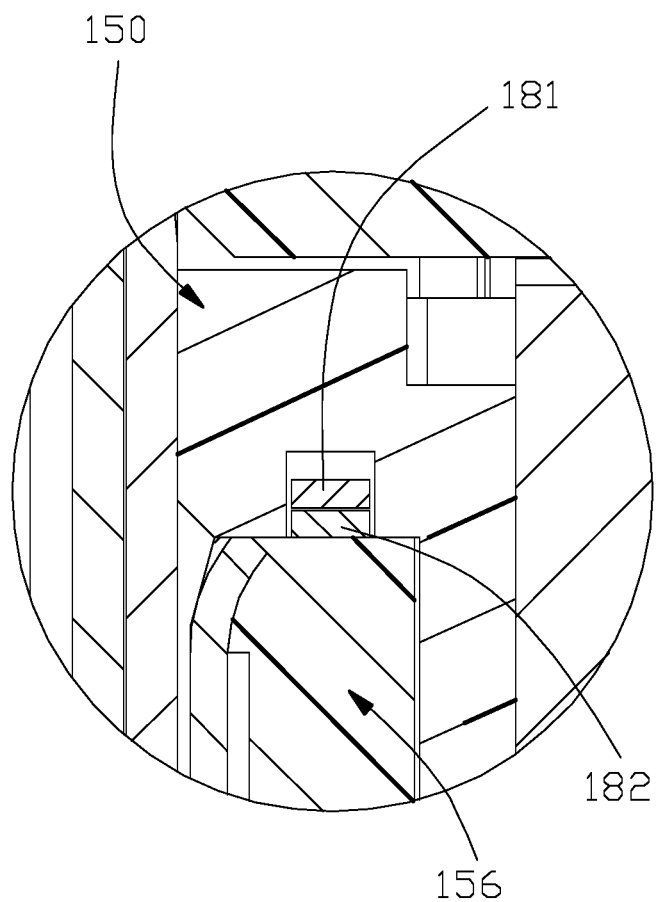
FIG. 16(B) is the cross-sectional view of the receptacle connector of FIG. 16(A) cooperating with the plug connector of FIG. 10.
Figure 17:
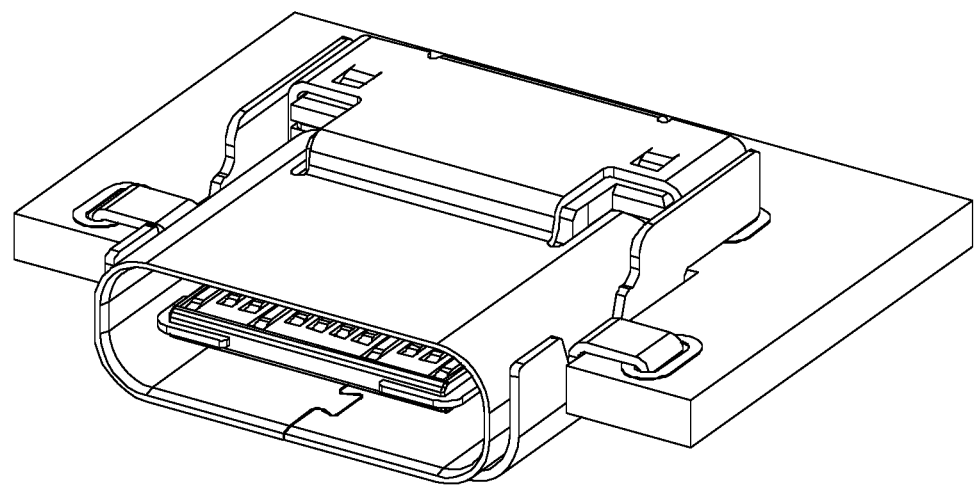
FIG. 17 is an assembled perspective view of a receptacle connector and a printed circuit board according to a second embodiment of the invention.
Figure 18:
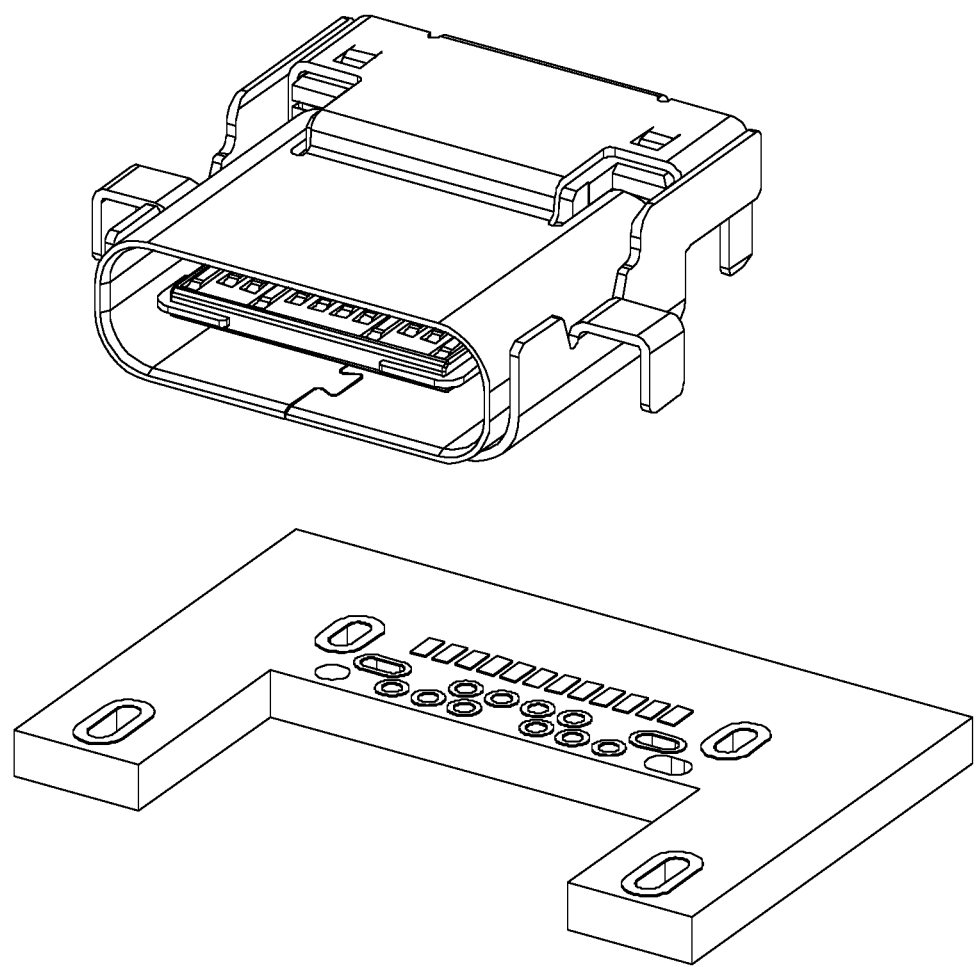
FIG. 18 is an exploded perspective view of the receptacle connector and the printed circuit board of FIG. 17.
Figure 19A:
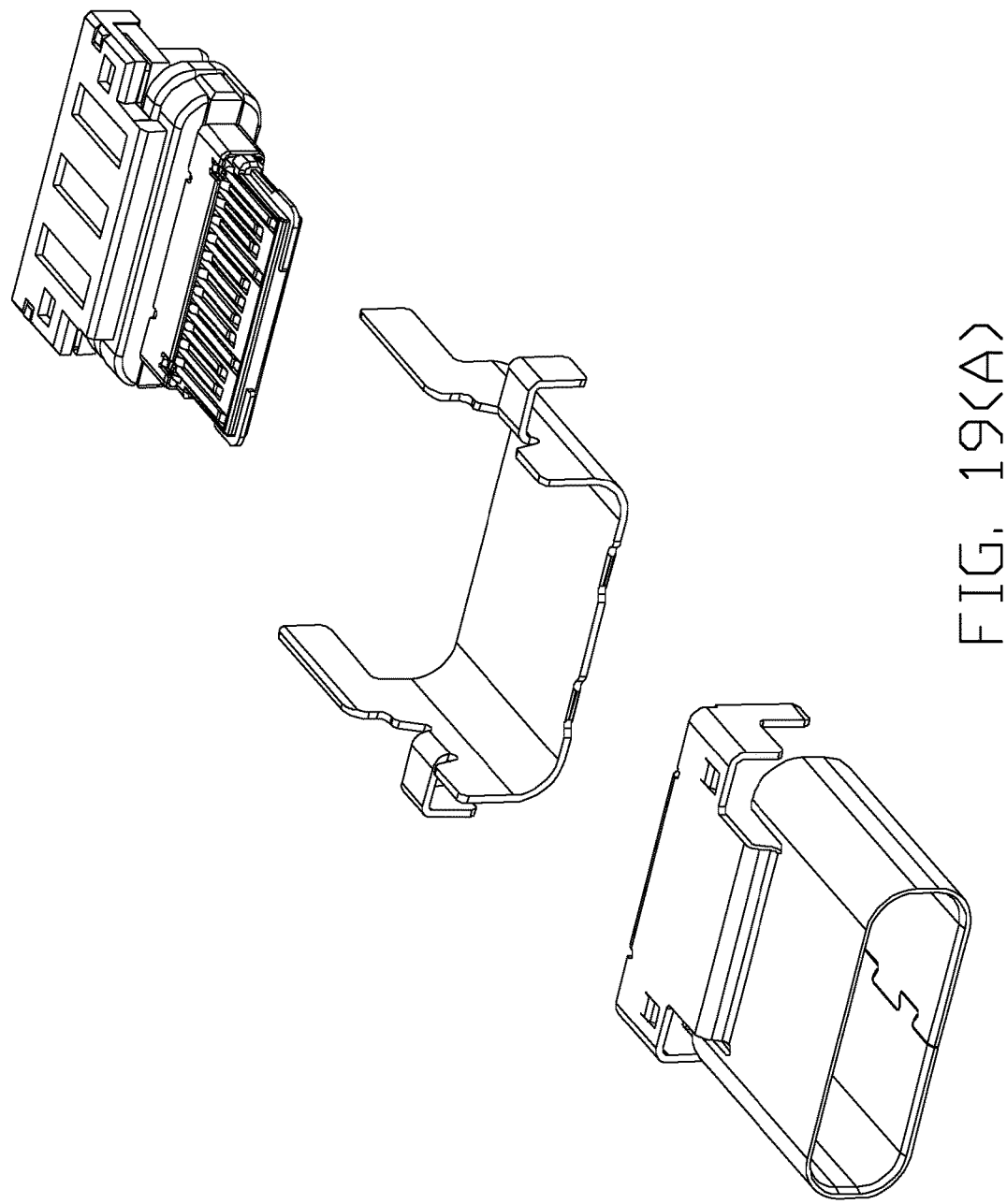
FIG. 19(A) is a front exploded perspective view of the receptacle connector of FIG. 18.
Figure 19B:
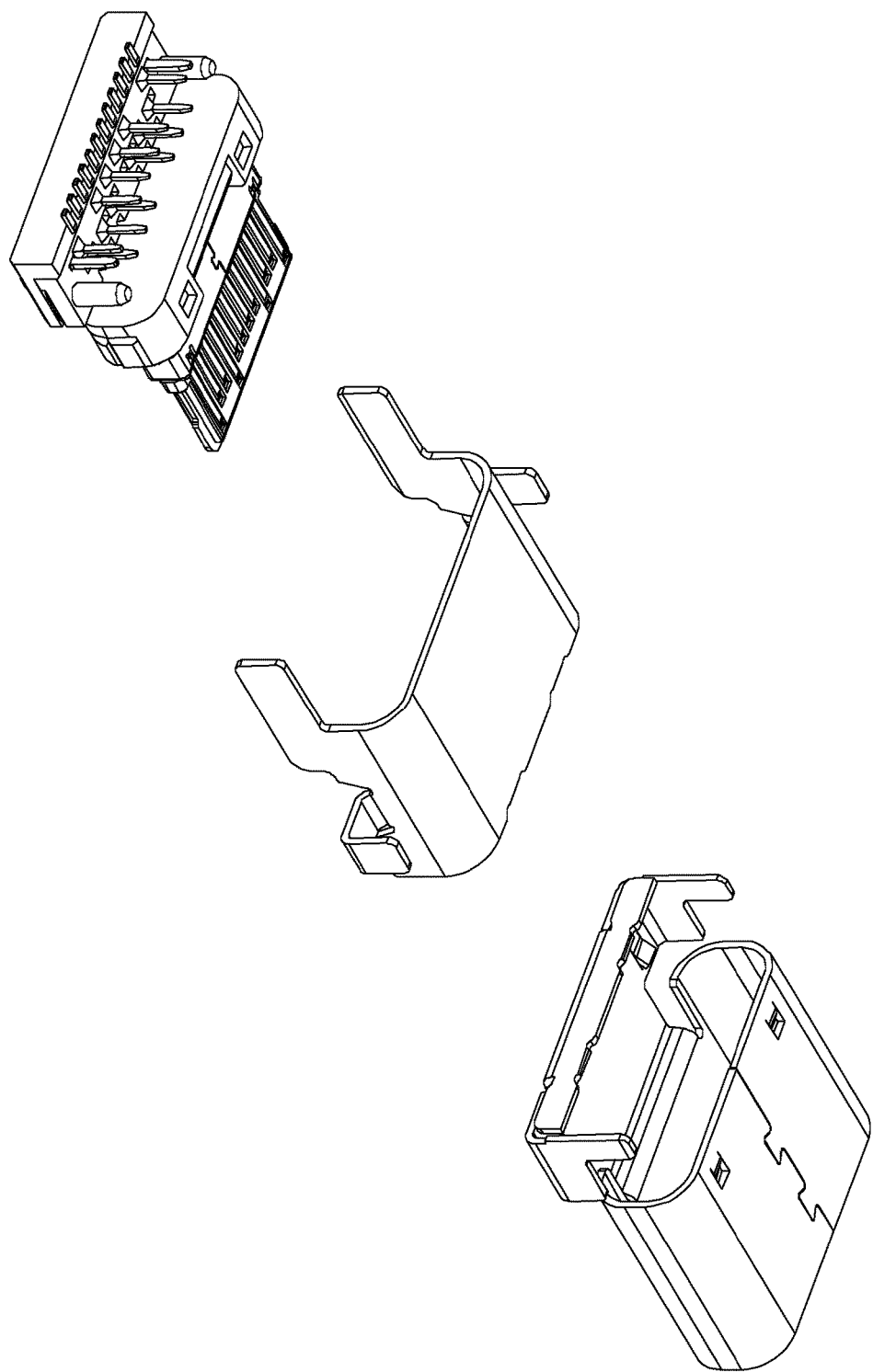
FIG. 19(B) is a rear exploded perspective view of the receptacle connector of FIG. 18.
Figure 20A:
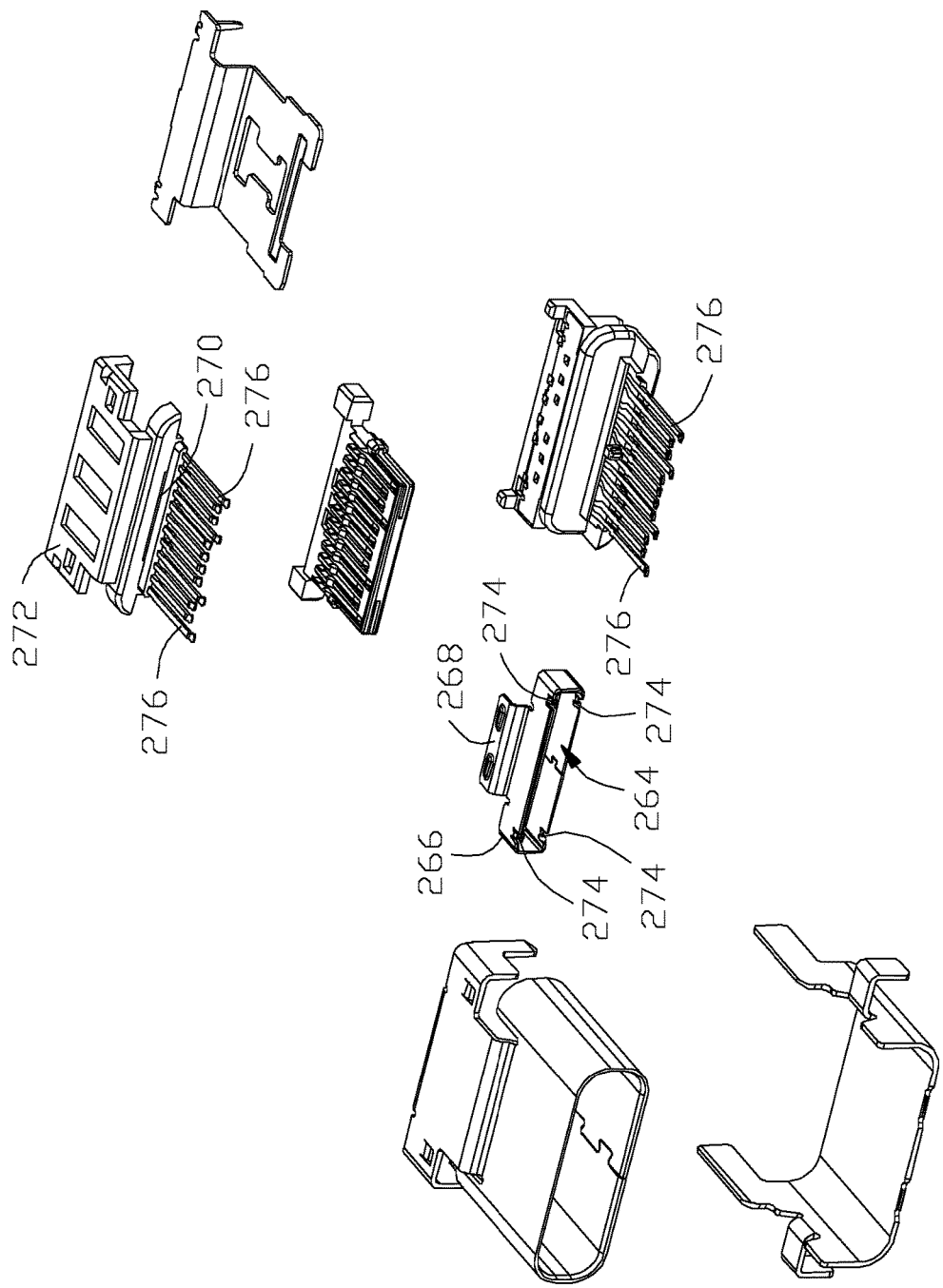
FIG. 20(A) is a further front exploded view of the receptacle connector of FIG. 19(A).
Figure 20B:
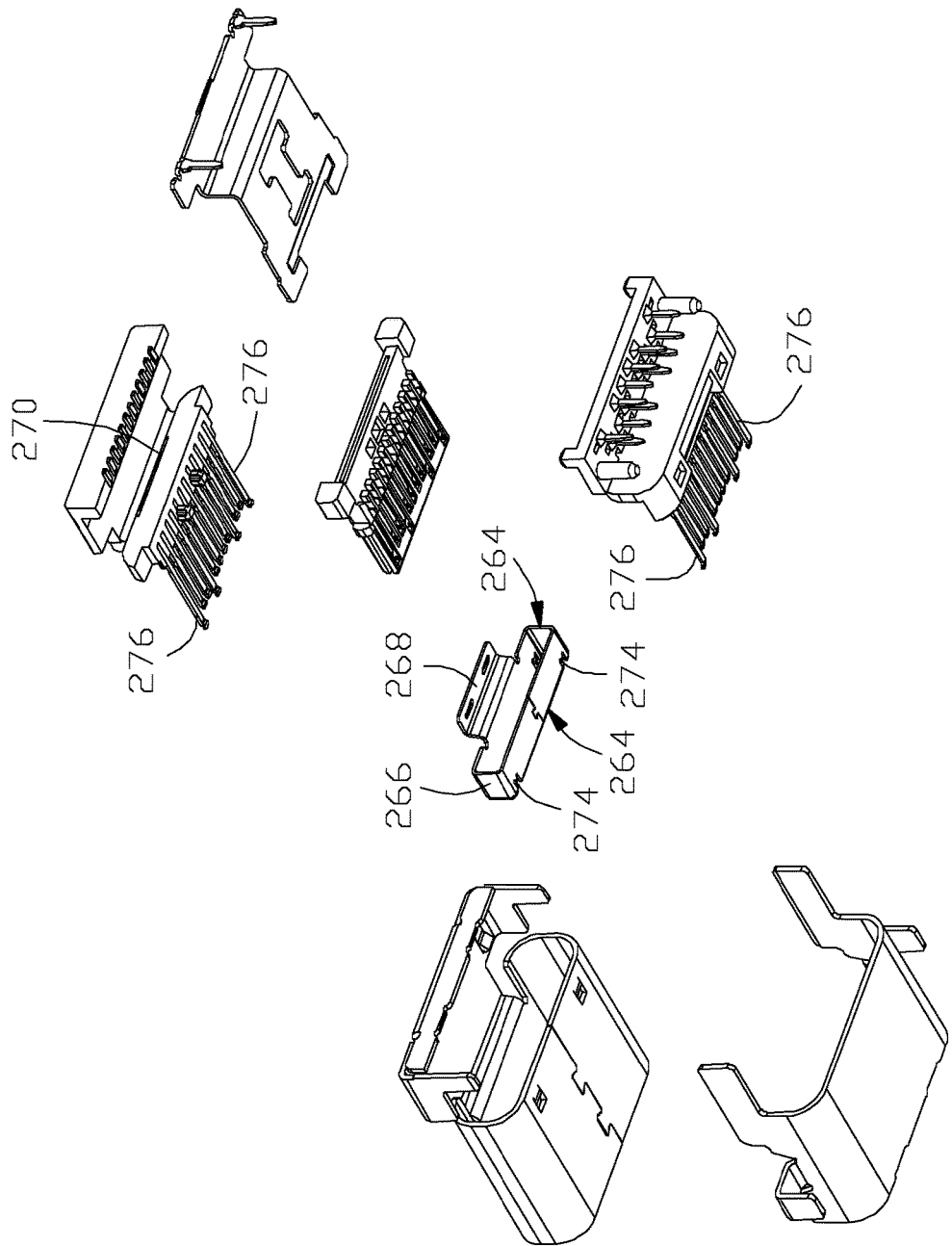
FIG. 20(B) is a further front exploded view of the receptacle connector of FIG. 19(B).
Figure 21:
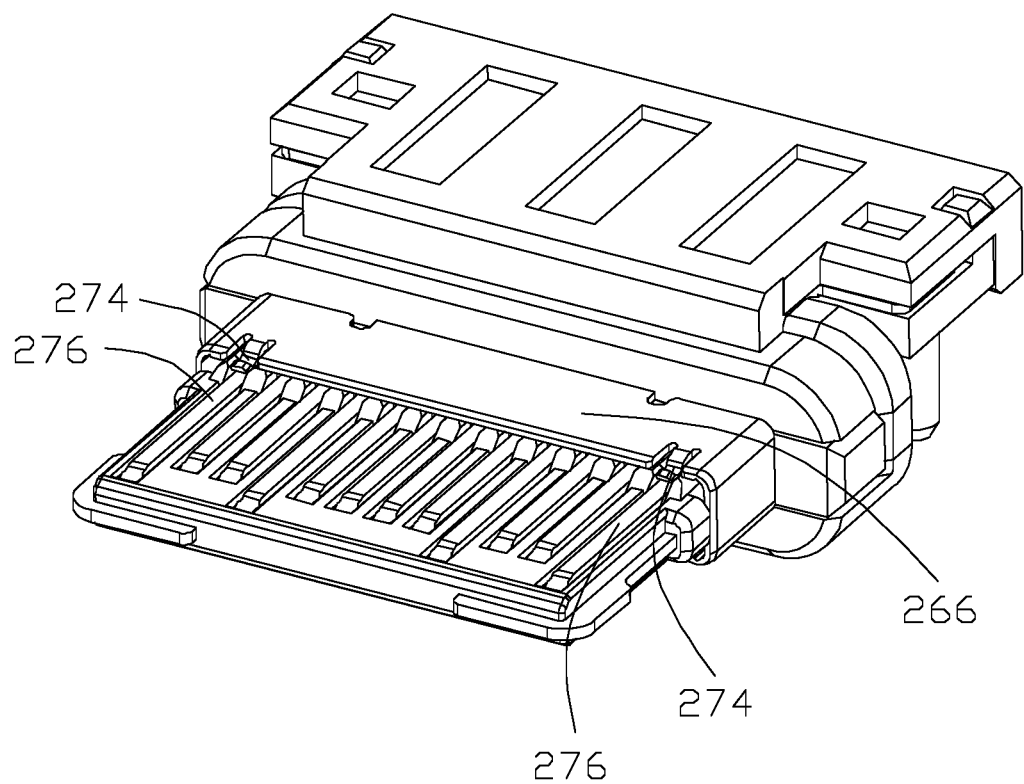
FIG. 21 is an assembled perspective view of a portion of the receptacle connector of FIG. 18.

As shown in FIGS. 16(A) and 16(B) which are derived from FIG. 14, the receptacle connector 150 can be optionally equipped with a pair of switch contacts 181, 182 spaced from each other in an open status when no plug or another type plug 152 which forms a recess 154 to receive the switch contact 182 during mating for not activating the switch function, is mated as shown in FIG. 16(A), or in a closed status when the corresponding plug 156 is mated which activates the switch function as shown in FIG. 16(B).

FIGS. 17-22 show a receptacle connector according to another embodiment of the invention wherein the primary differences with regard to the that disclosed in the first embodiment is the metallic collar 264 which further forms a retaining plate 268 rearwardly extending from the loop structure 266 and retained in the slit 270 of the upper piece 272 wherein a plurality of spring tabs 274 are formed on the loop structure 266 to mechanically and electrically connect to the corresponding grounding contacts 276.

Figure 28:
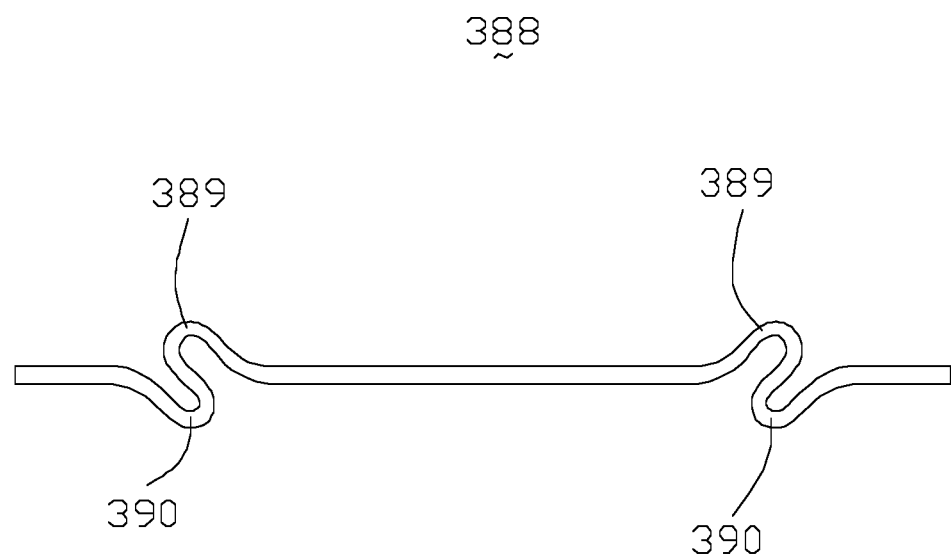
FIG. 28 is a cross-sectional view of the shielding plate of the receptacle connector of another embodiment variant with regard to that of the receptacle connector in FIG. 23.

FIGS. 23-27 show a receptacle connector according to a third embodiment of the invention wherein the primary differences with regard to that disclosed in the first embodiment is the shielding plate 376 including further a subsidiary plate 378 stacked thereupon. A pair of protrusions 380 unitarily bulged downwardly from the shielding plate 376 to replace and function as the corresponding grounding contacting section for the corresponding grounding contact 382 to be exposed on the lower surface of the mating tongue 384 wherein the front end of the corresponding grounding contact 382 mechanically and electrically connect to the protrusion 380. Understandably, the grounding contact 382 can be connected to other position of the shielding plate 376. Similarly, the subsidiary plate 378 forms a pair of bulged protrusions 386 unitarily extending upwardly to be exposed upon the upper surface of the mating tongue 384 for functioning as the contacting section of the corresponding grounding contact 382 with mechanical and electrically connection to the corresponding grounding contact 382. The similar structure, i.e., the raised-up portion of the shielding plate to replace the contacting section of the corresponding grounding contact can be further referred to the co-pending application Ser. No. 13/757,740 filed Feb. 2, 2013. Understandably, the shielding plate 376 and the subsidiary plate 378 may be unified as one piece 388 and form the corresponding aligned upper and lower protrusions 389, 390 unitarily as shown in FIG. 28.

Figure 29:
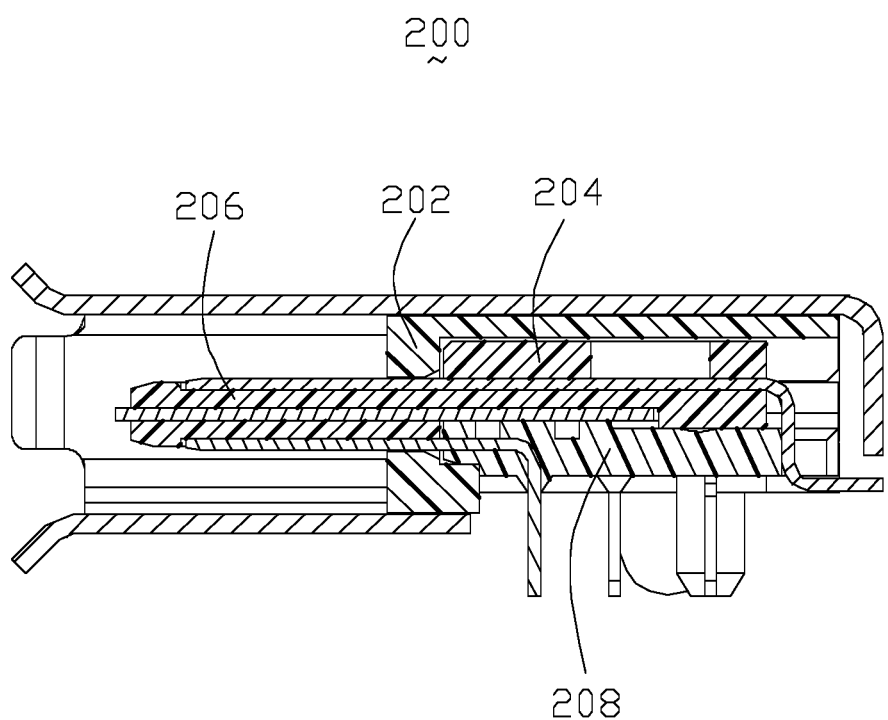
FIG. 29 is a cross-sectional view of a receptacle connector of a fourth embodiment of the invention.
Figure 35:
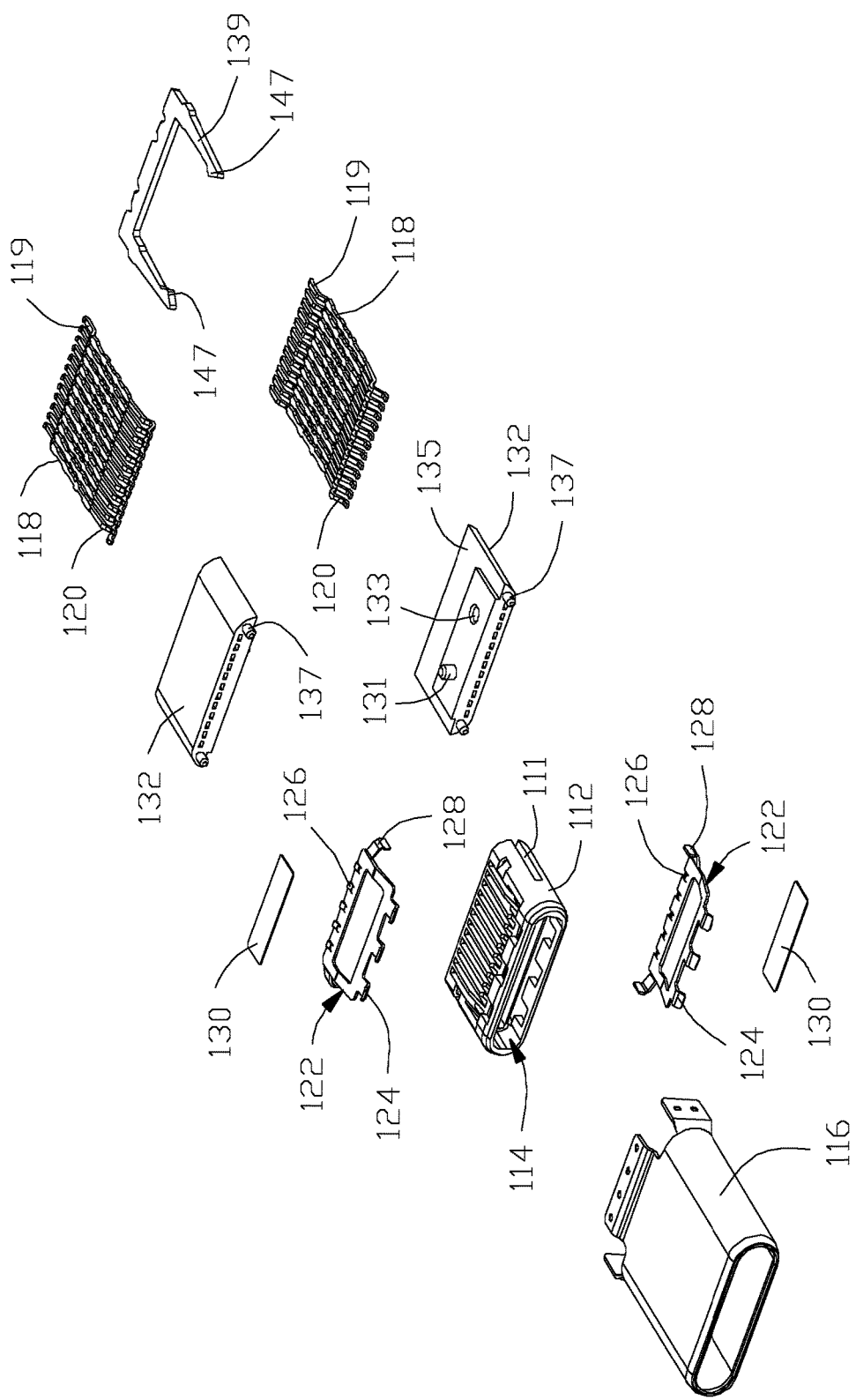
FIG. 35 is a further exploded front perspective view of a partial portion of the plug connector of FIG. 34.
Figure 36:
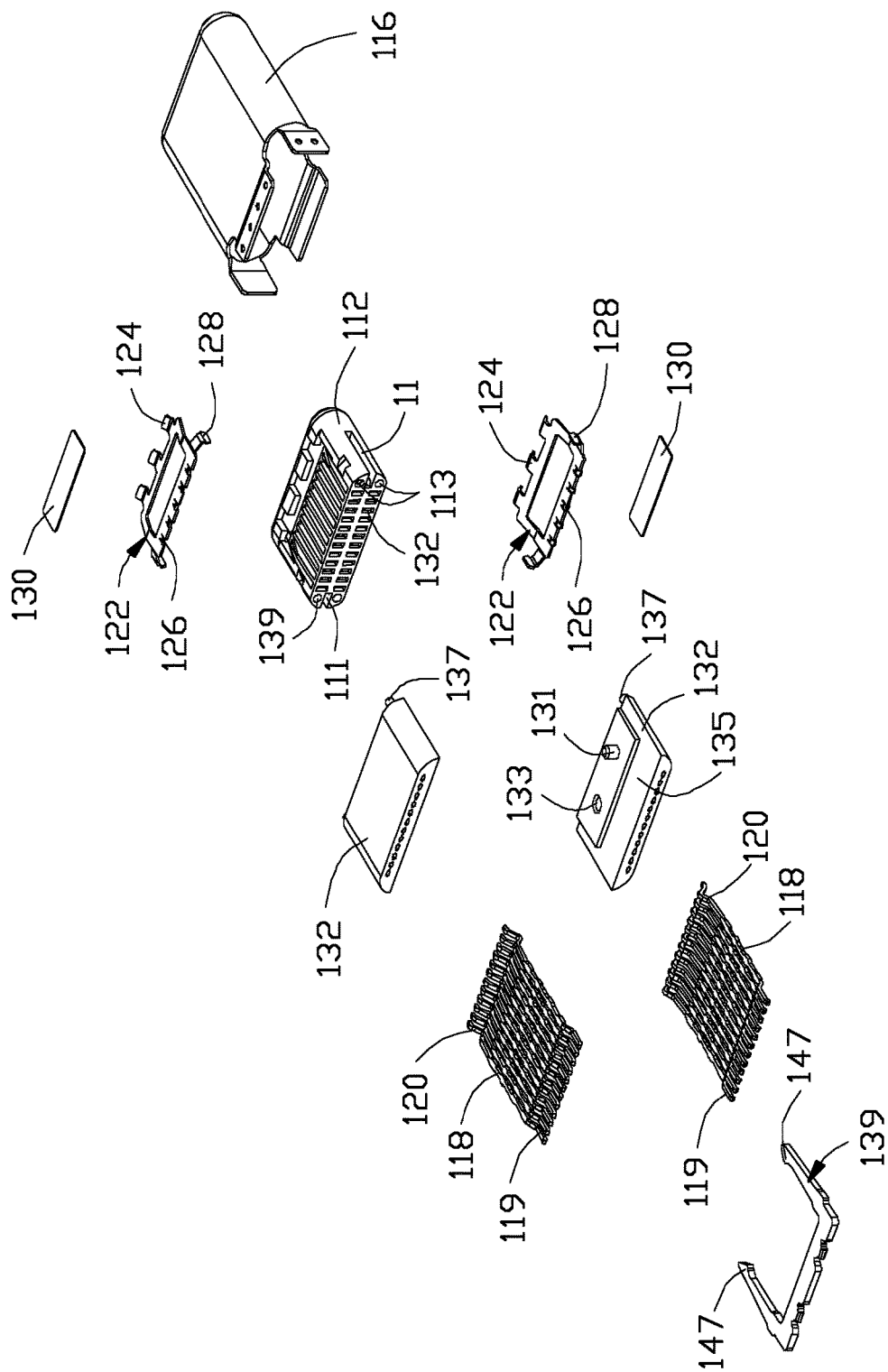
FIG. 36 is a further exploded rear perspective view of the partial portion of the plug connector of FIG. 34.
Figure 37:
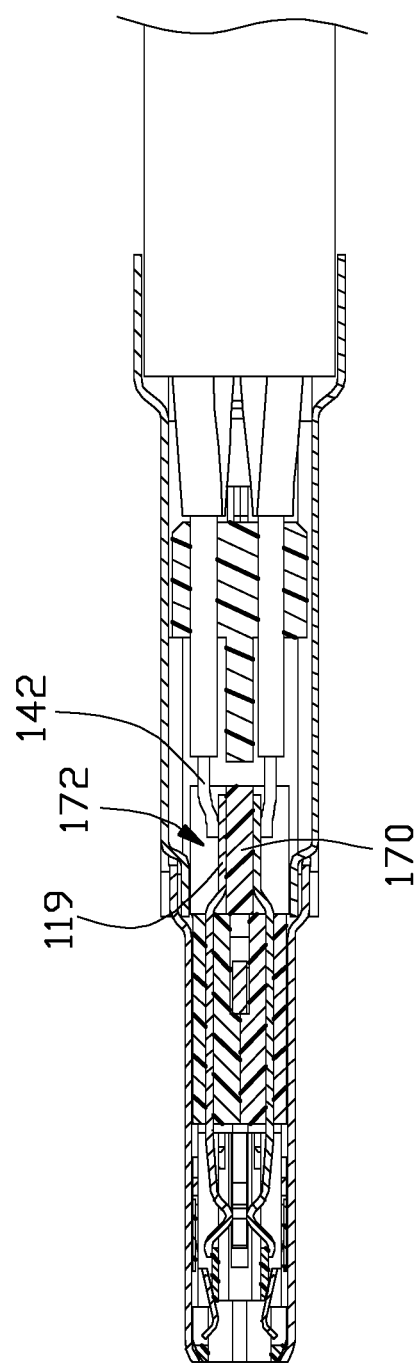
FIG. 37 is a cross-sectional view of the plug connector according to another embodiment of the invention wherein the paddle card is removed and the contact tail is soldered to the corresponding wire in the corresponding groove of the spacer attached to the rear side of the housing.
Figure 38:
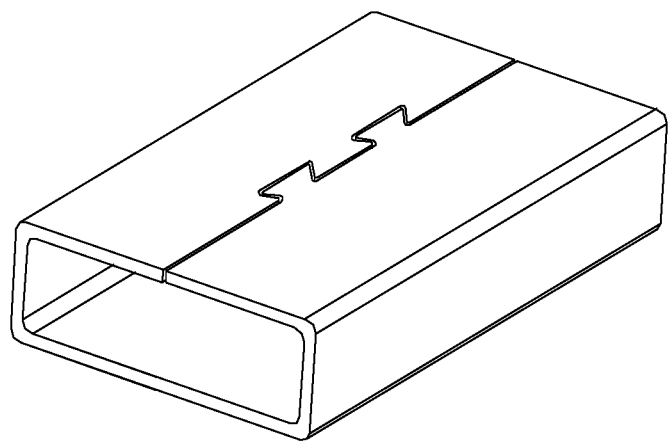
FIG. 38 is a perspective view of the metallic shell set made of one piece in place of the two halves shell in the previous embodiment.
Figure 39:
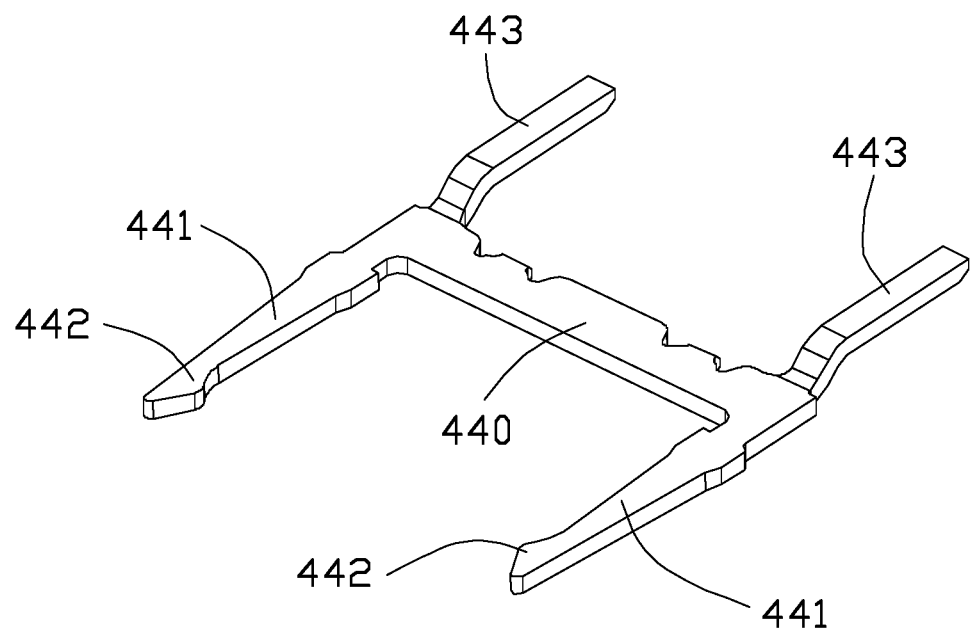
FIG. 39 is a perspective view of a latch of a plug connector according to a seventh embodiment of the invention.
Figure 40:
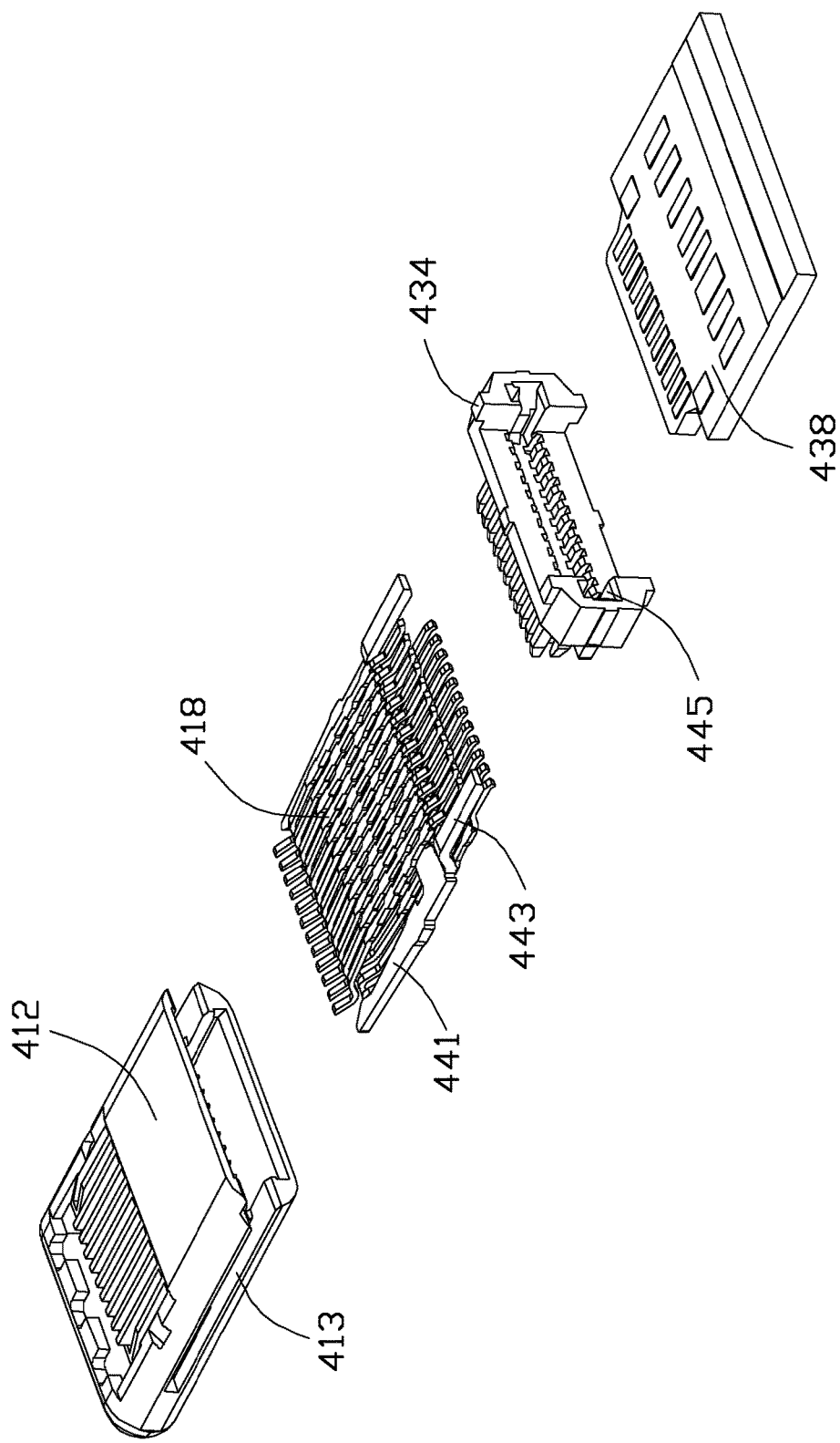
FIG. 40 is an exploded perspective view of a portion of the plug connector of FIG. 39 to show how the latch is assembled in the housing in front of the spacer.
Figure 41:
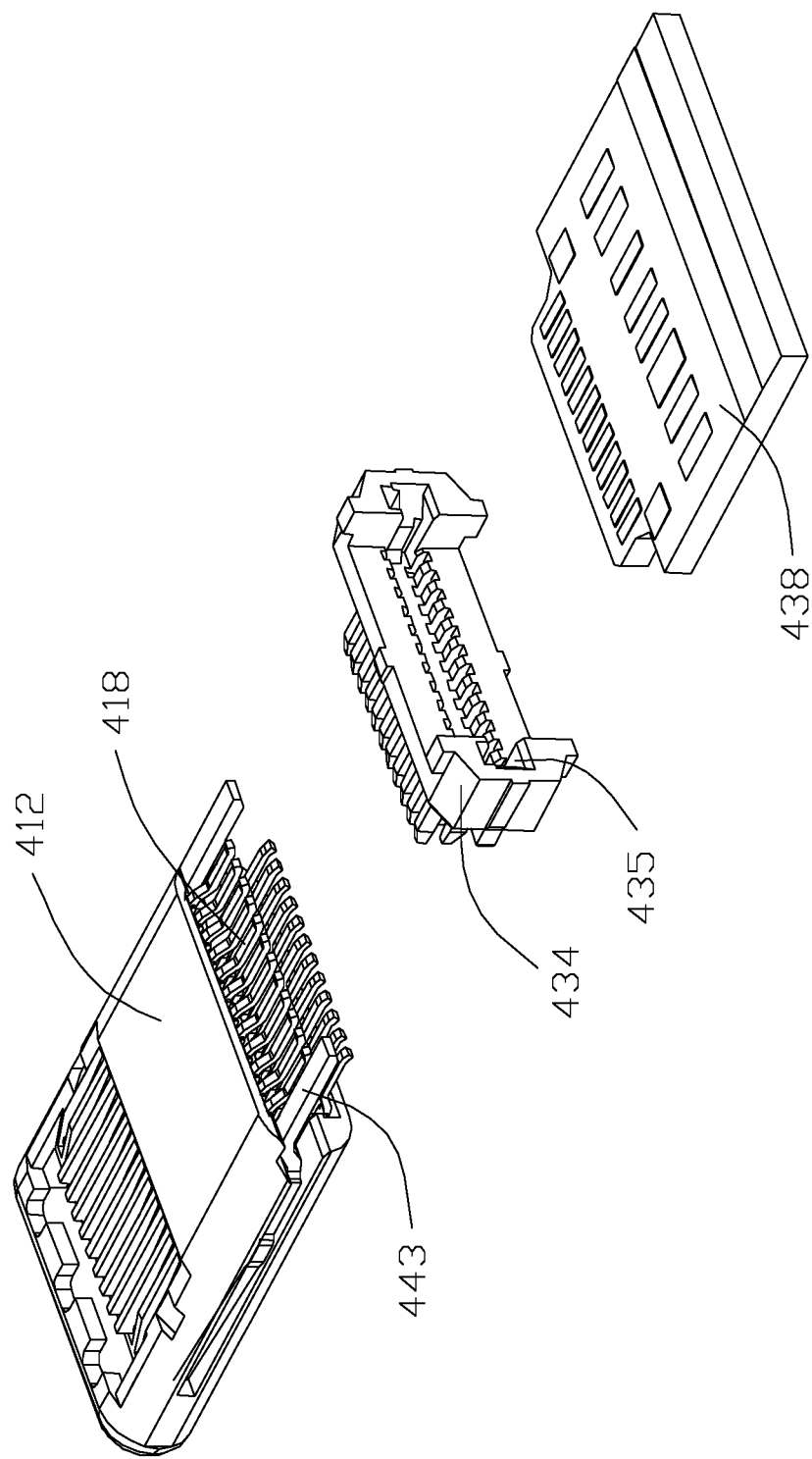
FIG. 41 is a partially assembled perspective view of the plug connector of FIG. 40 to show how the latch is assembled in the housing in front of the spacer.
Figure 42:
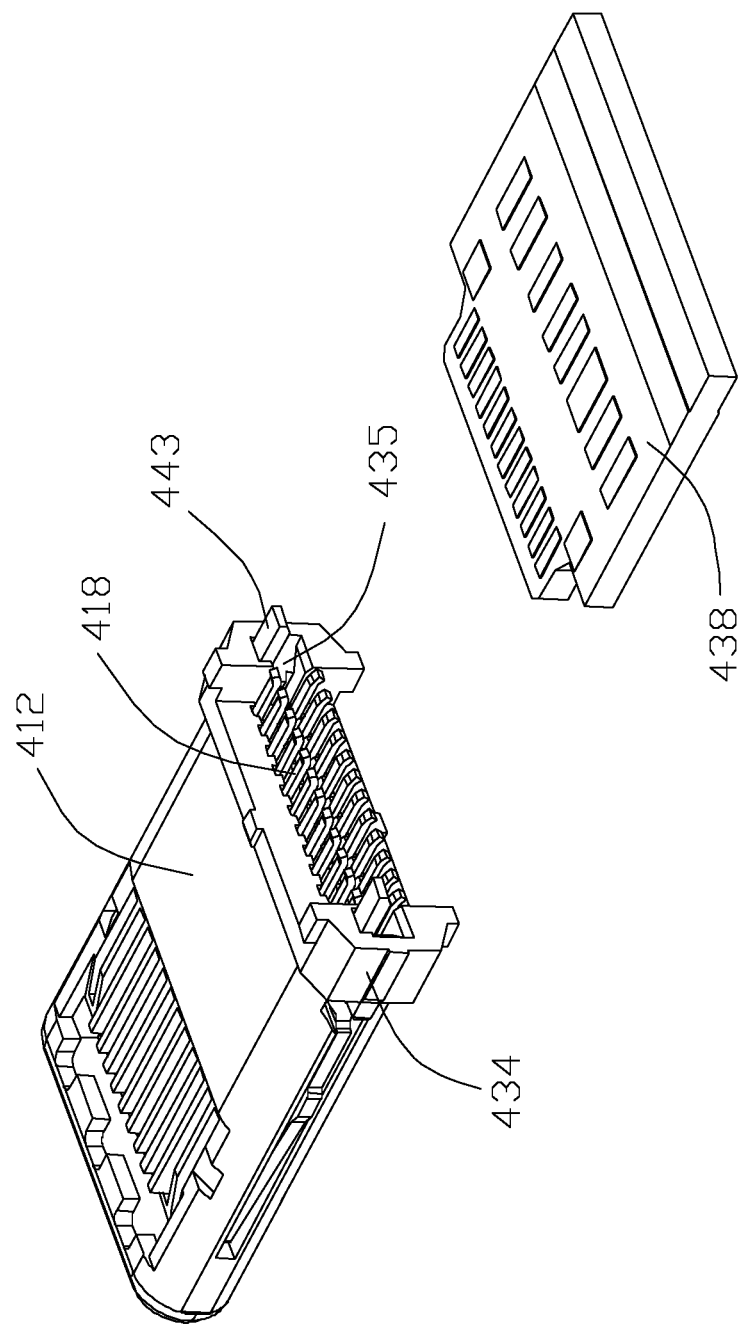
FIG. 42 is a partially perspective view of the plug connector of FIG. 41 to show how the latch is assembled in the spacer.
Figure 43:
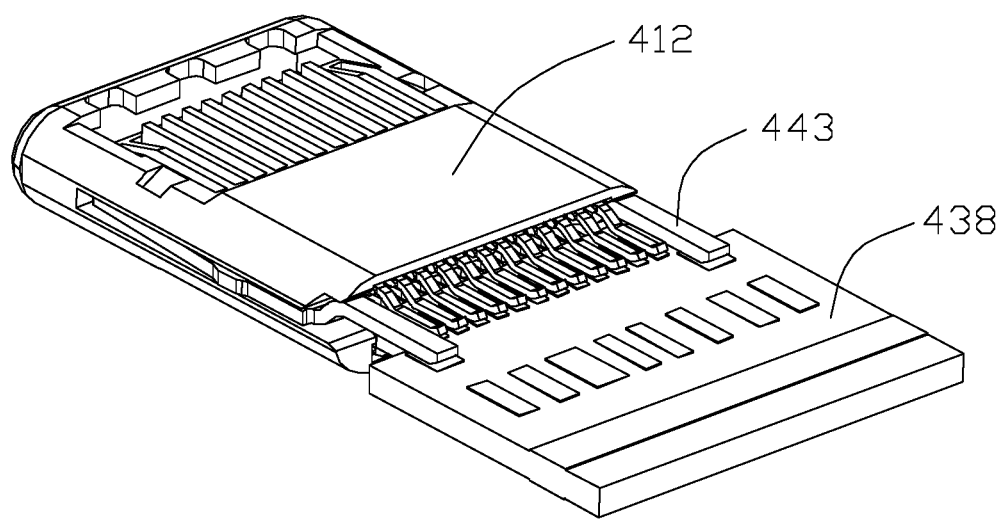
FIG. 43 is a front assembled perspective view of the plug connector of FIG. 42 to show how the latch is assembled to the paddle card.
Figure 44:
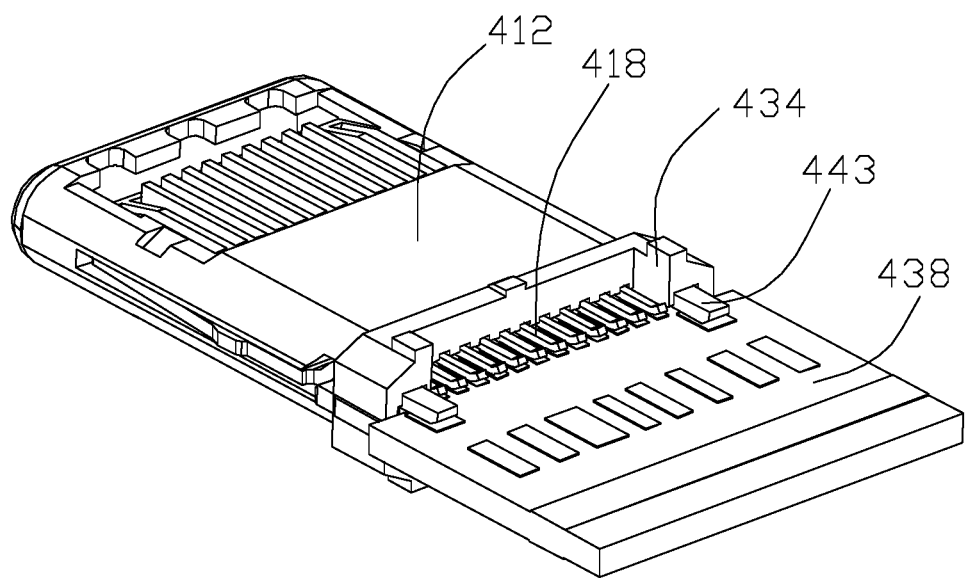
FIG. 44 is a rear assembled perspective view of the plug connector of FIG. 42 to show how the latch is assembled to the paddle card.
Figure 45:
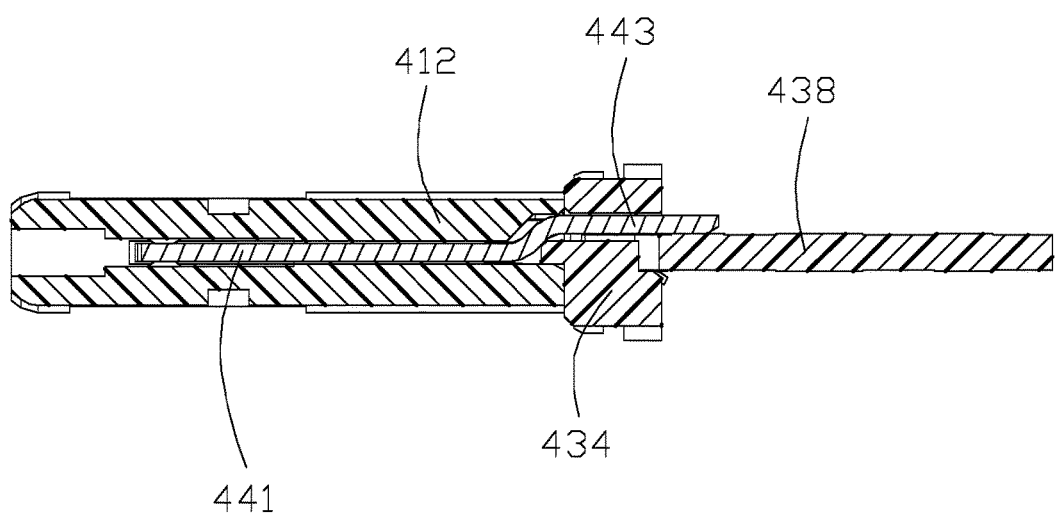
FIG. 45 is a cross-sectional view of the plug connector of FIG. 44 to show how the latch is engaged with the paddle card.

FIG. 29 shows the receptacle connector 200 of a fourth embodiment of this invention, with the insulative housing 202 having an through opening and the upper terminal module 204 with the mating tongue 206 extending through the through opening and the lower terminal module 208 assembled to the upper terminal module 204 with the corresponding contacting sections of the contacts exposed upon the mating tongue. Understandably, the design shown in FIG. 22 of the provisional application 61/926,270 is another approach. The design shown in FIG. 35 of the provisional application 61/953,737 also shows another approach wherein the upper terminal module may be modified to allow the shielding plate to be first assembled thereto compared with insert molded therein, and later the upper contacts may be assembled into the mating tongue.

Figure 30:
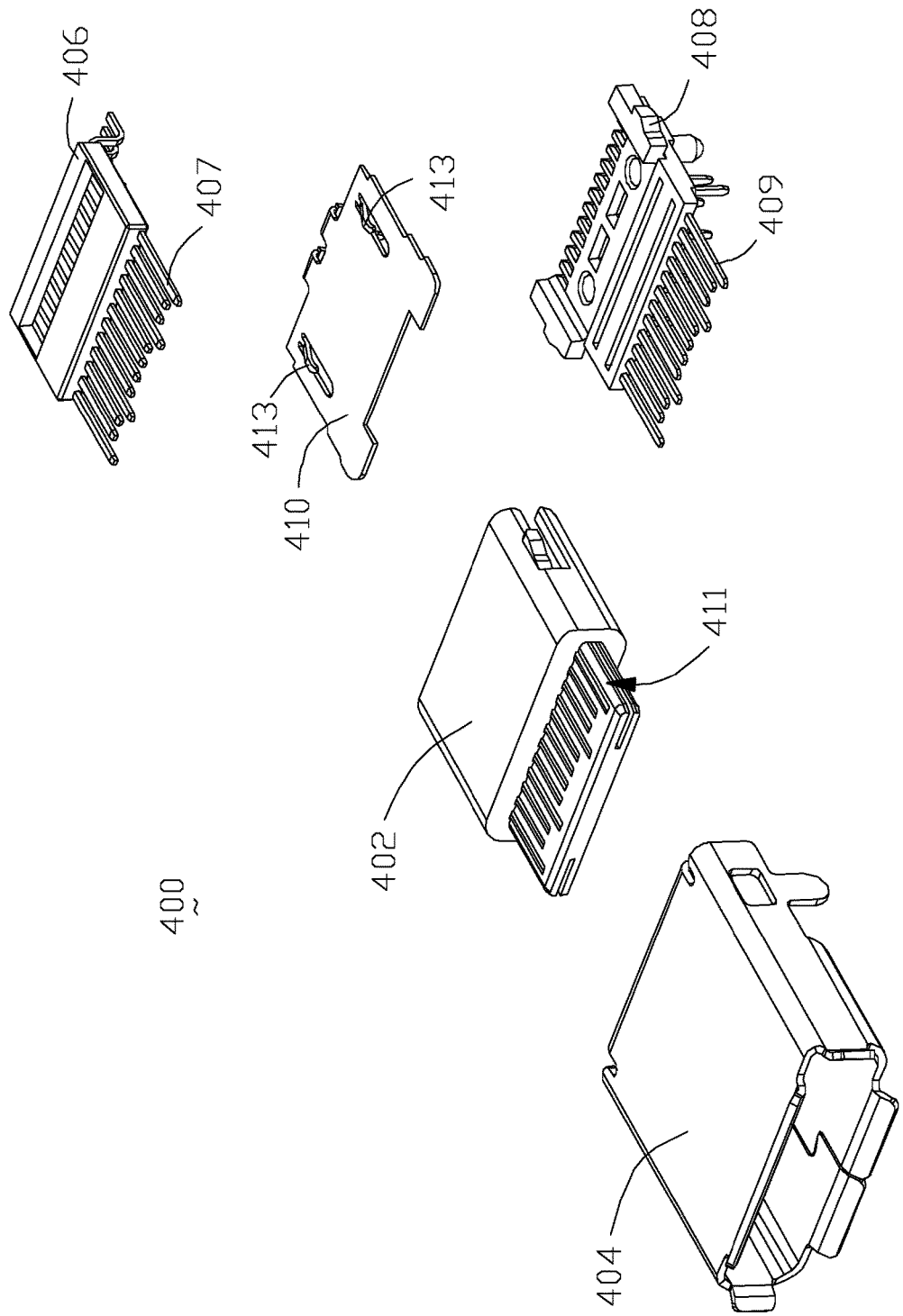
FIG. 30 is a front exploded perspective view of a partial portion of a receptacle connector according to a fifth embodiment of the invention as shown in the previous Ser. No. 61/953,737.
Figure 31:
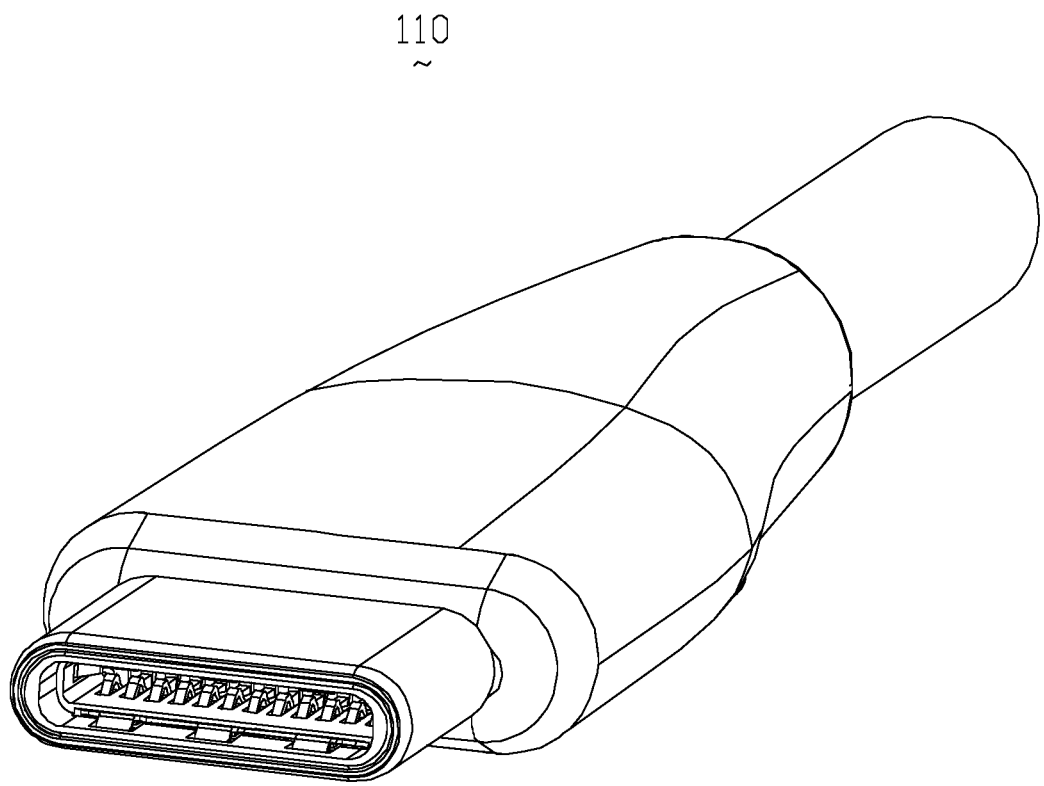
FIG. 31 shows a plug connector according to a sixth embodiment of the invention.
Figure 32:
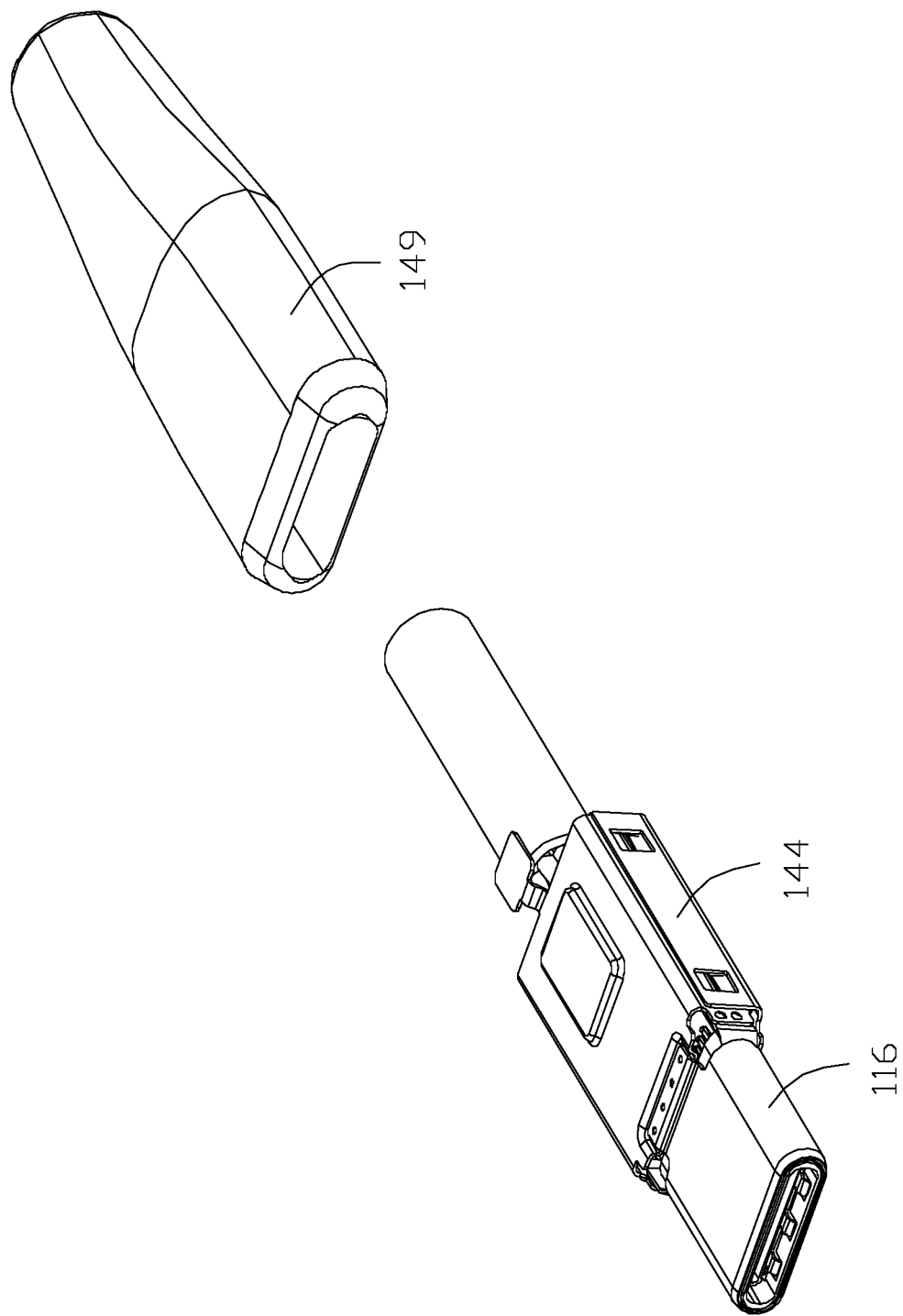
FIG. 32 is an exploded perspective view of the plug connector of FIG. 15.
Figure 33:
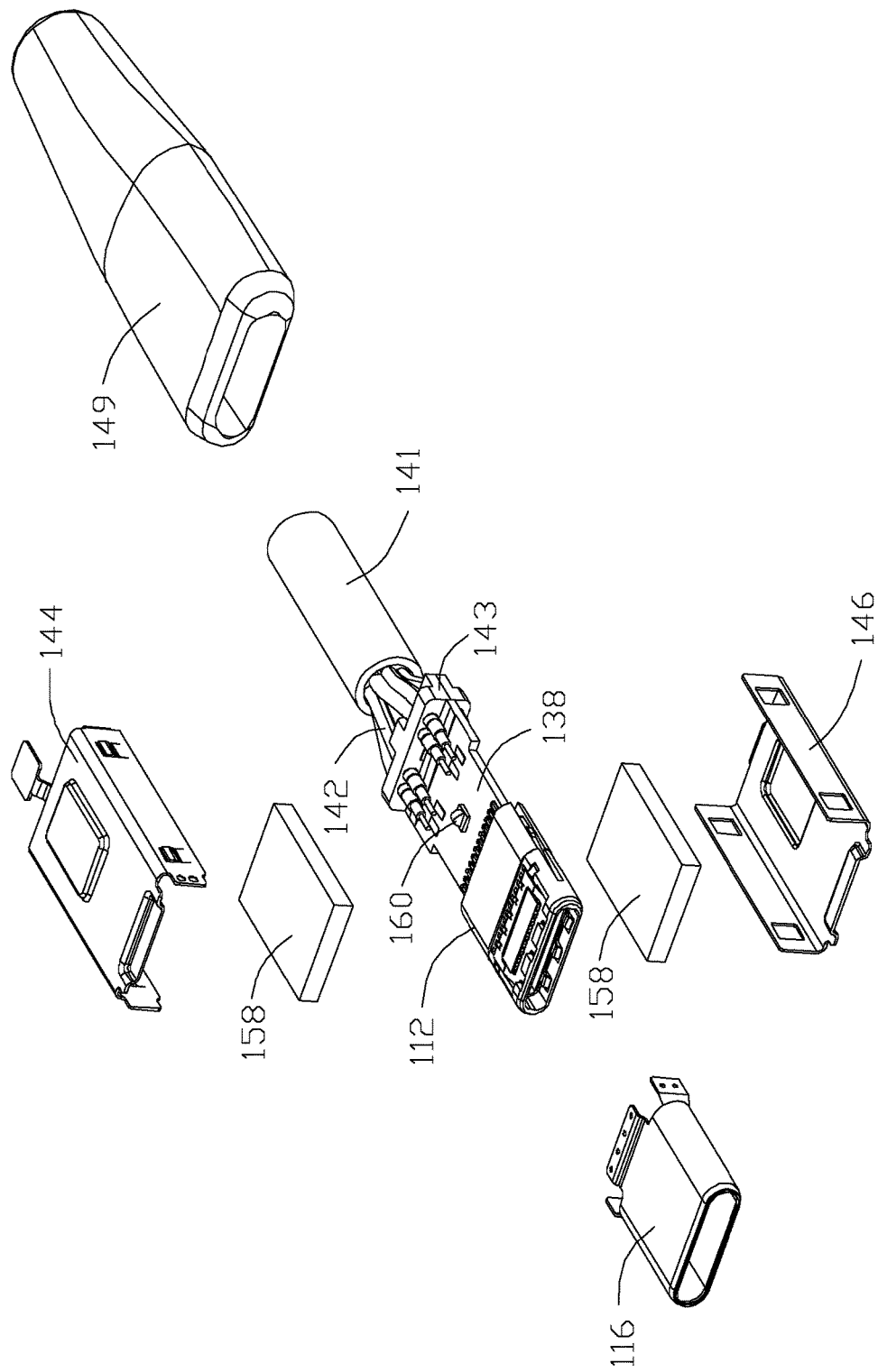
FIG. 33 is a further exploded perspective view of the plug connector of FIG. 32.
Figure 34:
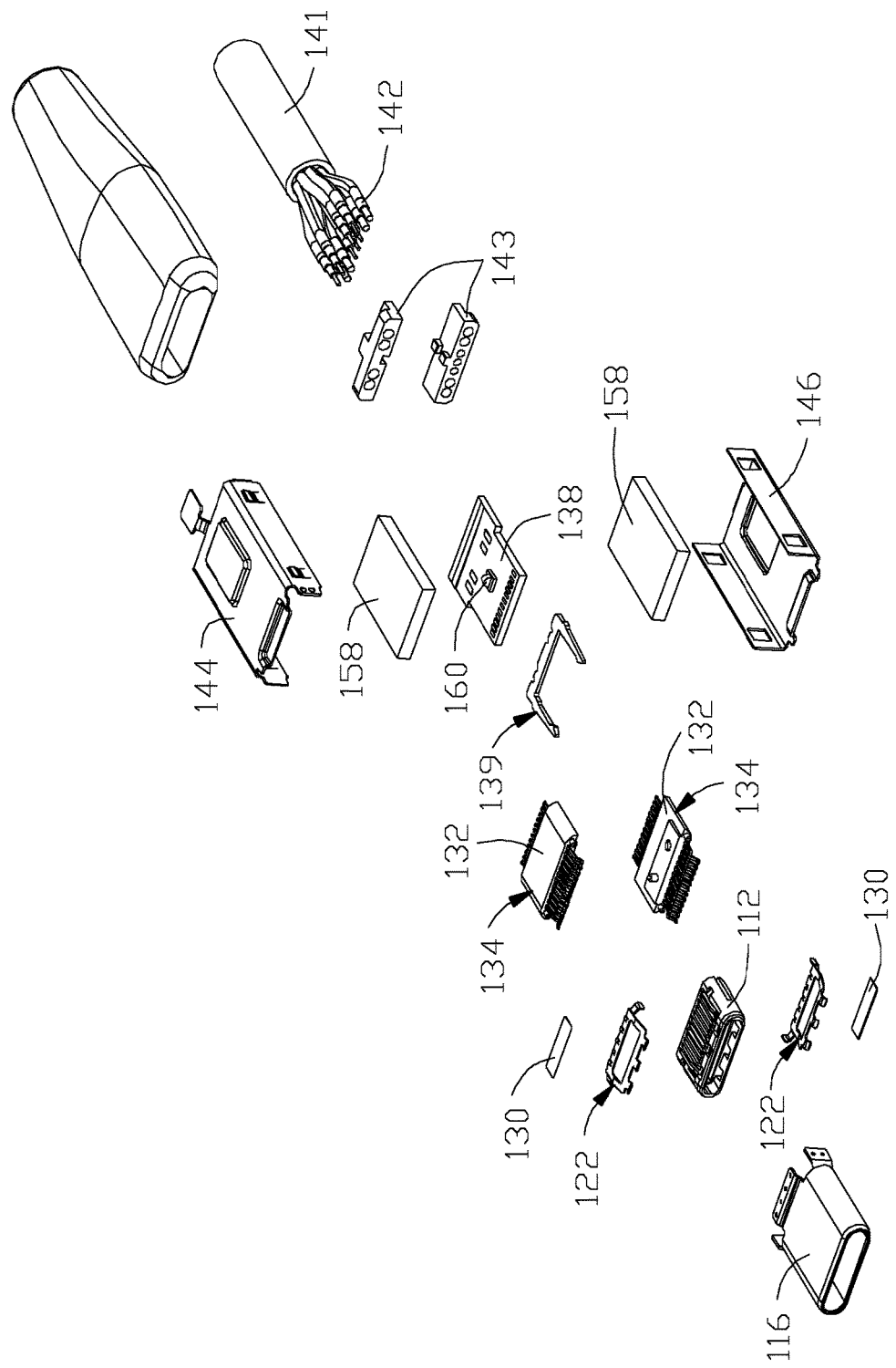
FIG. 34 is a further exploded perspective view of the plug connector of FIG. 33.

FIG. 30 shows a receptacle connector of a fourth embodiment of this invention in the instant application is to correct the positions of the spring fingers 413 so as to have it correctly aligned with the outermost grounding contacts in the vertical direction for connection therebetween. Understandably, the grounding contact may be deformed to contact the shielding plate instead as shown in 61/773,150 filed Mar. 6, 2013.

FIGS. 31-36 show sixth embodiment of the plug connector 110, which includes an insulative housing 112 having a capsular front contour with a rectangular receiving cavity 114 therein and enclosed in a metallic shell 116. Opposite upper and lower rows of contacts 118 are disposed in the corresponding passageways 132 of the housing 112 with corresponding contacting sections 120 extending into the receiving cavity 114. A pair of upper and lower EMI (Electro-Magnetic Interference) spring plates 122 are enclosed in the shell 116, and each of the EMI spring plates 122 is sandwiched between the shell 116 and the housing 112 and includes a front resilient region 124 extending inwardly toward the receiving cavity 114 and in front of the contacting sections 120, a rear abutting region 126 to abut against the shell 116, and a pair of side retention regions 128 retainably engaged within corresponding side portions of the housing 12. A pair of insulating tapes 130 is disposed upon two opposite sides of the housing 112 so as to isolate the contacting section 120 from the shell 116.

Each of the upper and lower rows of contacts 118 are integrated by an insulator 132 via an insert molding process to form a terminal module 134 thereof. Each insulator 132 located behind the housing 112, forms an assembling post 131 and an assembling hole 133 on an inner side to be coupled with those of the other insulator 132 to assembling the pair of terminal module 132 together wherein a U-shaped recess 135 is formed in the inner side of each insulator 132 to receive a U-shaped metallic latch 139. The housing forms a pair of side slots 111 to receive two opposite side arms of the latch 139 wherein the heads 147 of the side arms extend into the receiving cavity 114. A pair of posts 137 are located on a front side of the insulator 132 to be inserted into the corresponding pair of holes 113 in a rear side of the housing 112 to assemble the housing 112 and the insulator 132 together. Each contact 118 further includes a tail 119 mounted to a front region of a paddle card 138 which is located behind the insulators 132. A cable 141 located behind the paddle card 138, includes a plurality of wires 142 respectively soldered upon the rear region of the paddle card 138. Understandably, alternately the paddle card 138 may be replaced by a spacer 170 (FIG. 21) with grooves 172 each to regulate and receive therein the corresponding tails 119 and wires 142 soldered with each other.

Figure 22:
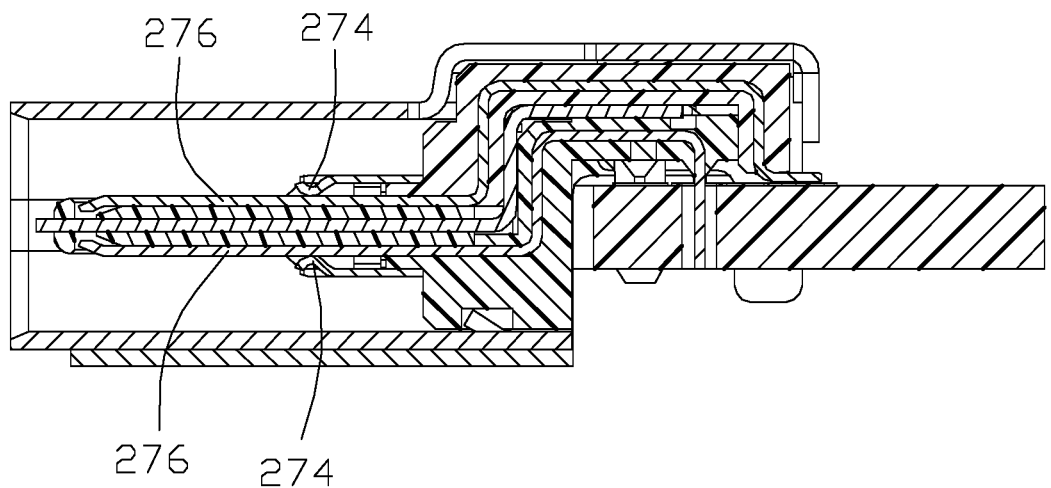
FIG. 22 is a cross-sectional view of the receptacle connector and the printed circuit board of FIG. 17.
Figure 23:
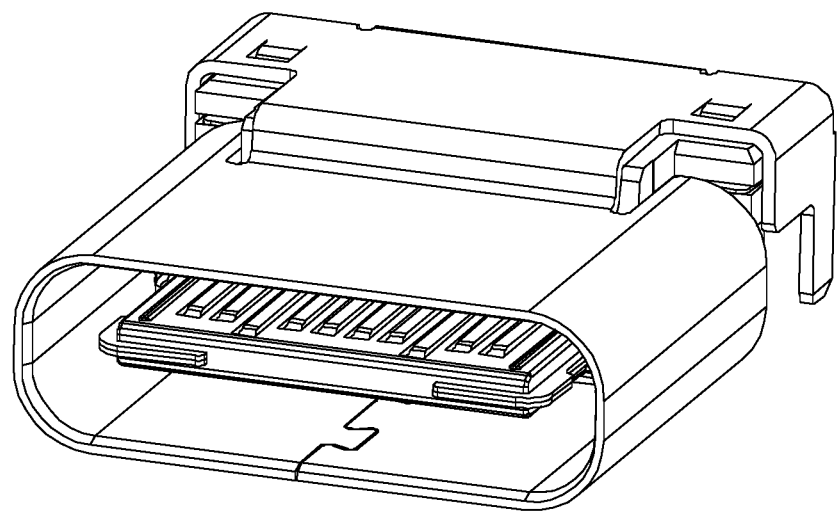
FIG. 23 is an assembled perspective view of a receptacle connector according to a third embodiment of the invention.
Figure 24A:
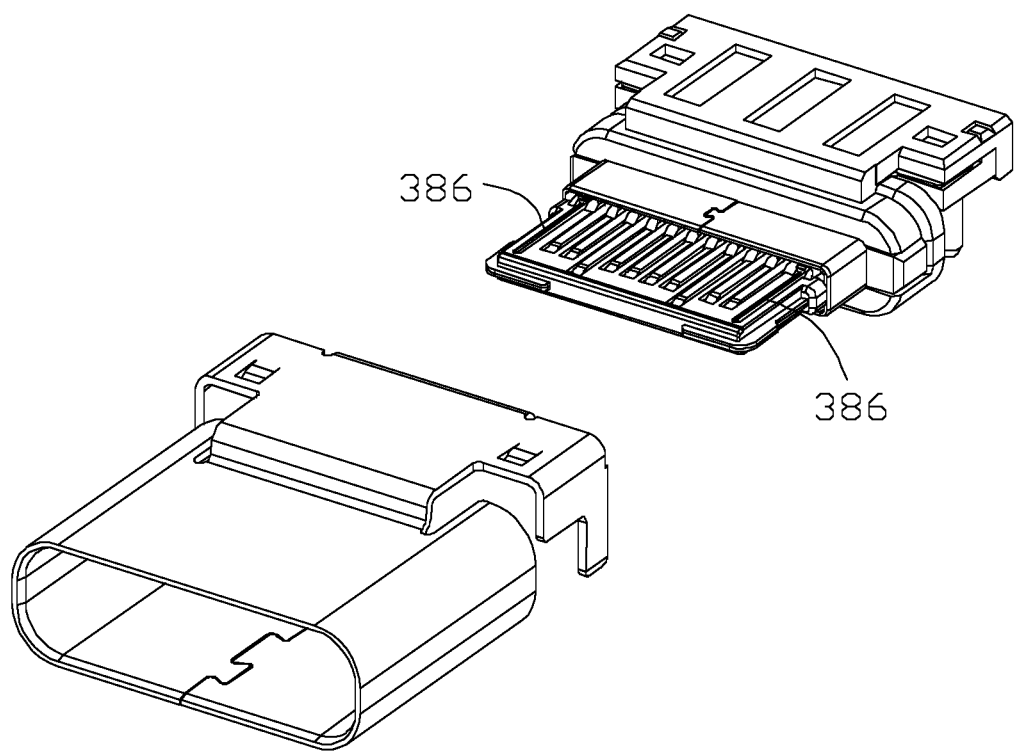
FIG. 24(A) is a front exploded perspective view of the receptacle connector of FIG. 23
Figure 24B:
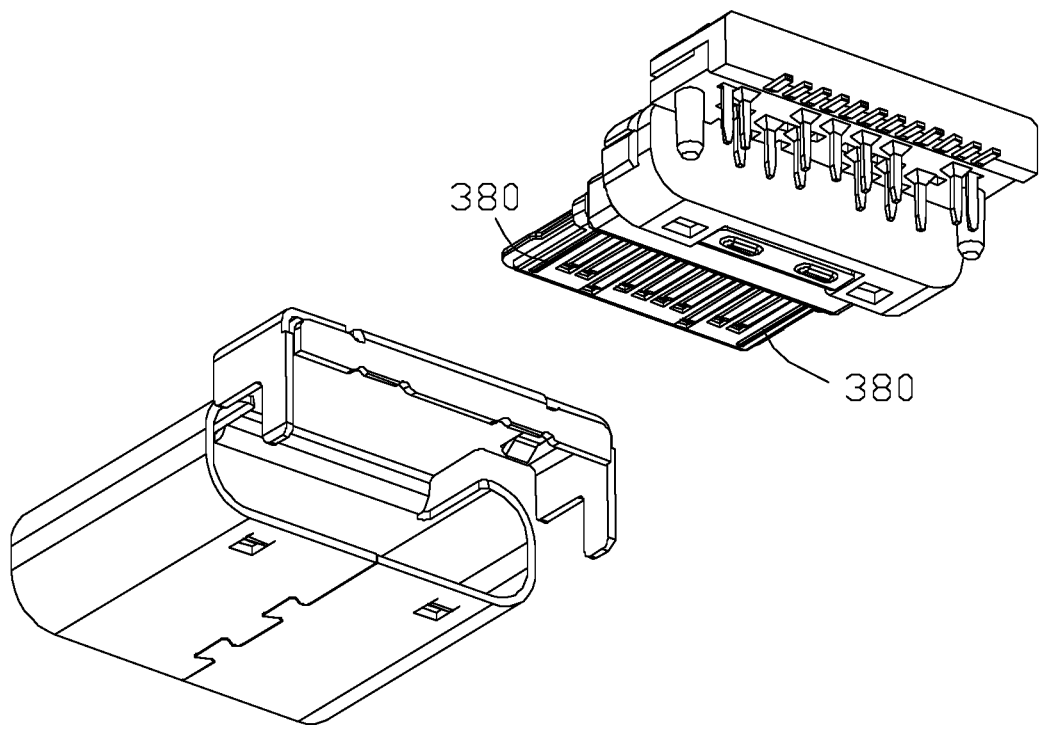
FIG. 24(B) is a rear exploded perspective view of the receptacle connector of FIG. 23
Figure 25A:
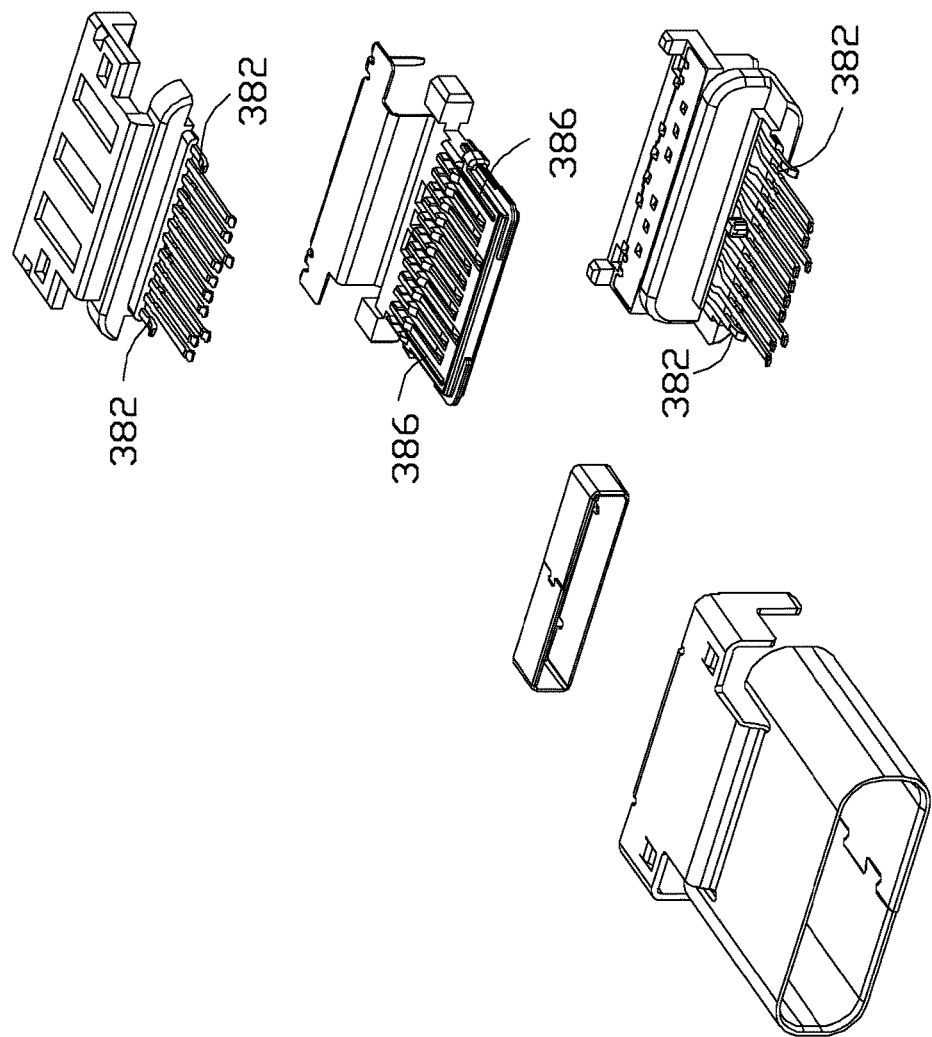
FIG. 25(A) is a further front exploded view of the receptacle connector of FIG. 24(A).
Figure 25B:
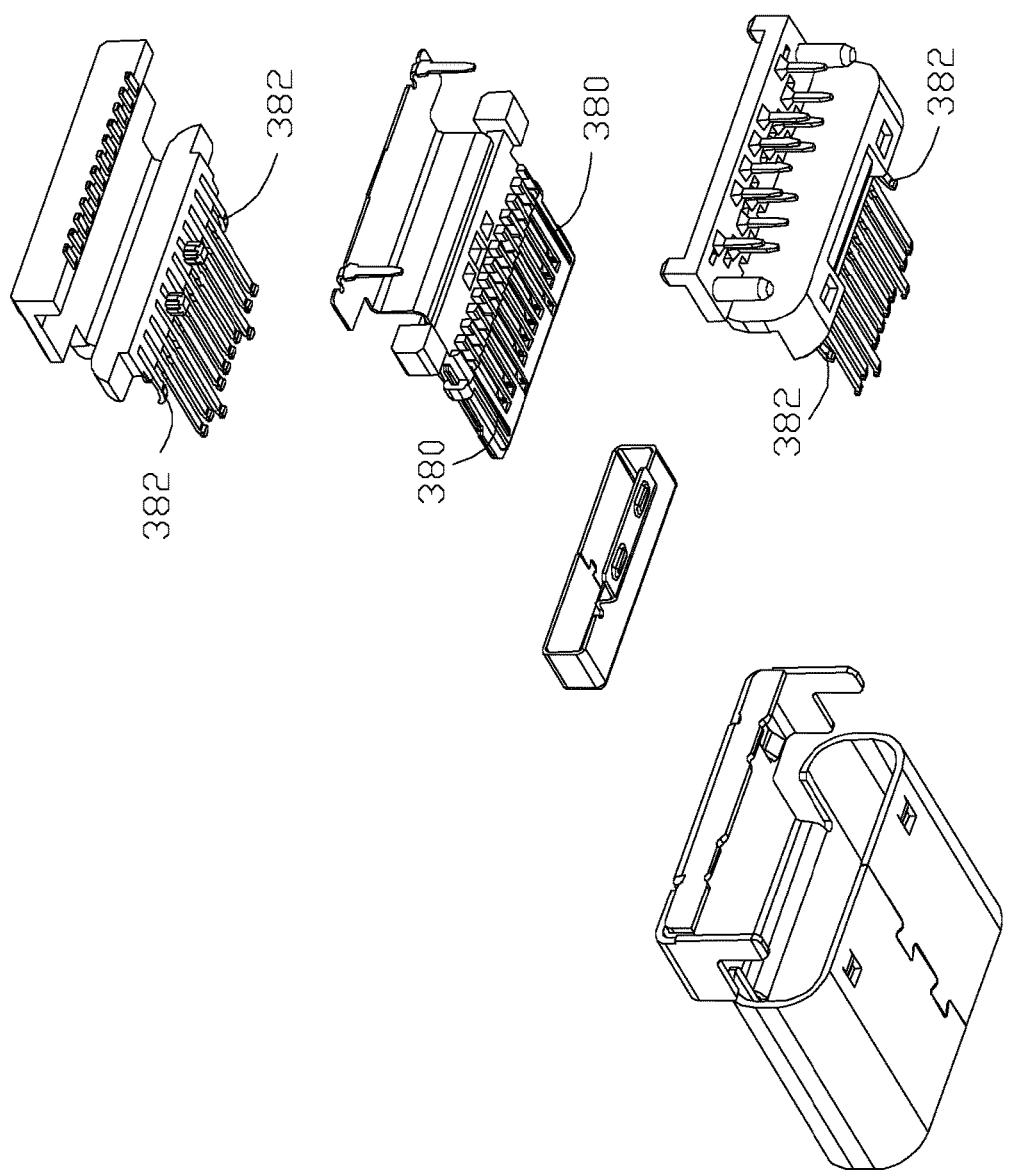
FIG. 25(B) is a further front exploded view of the receptacle connector of FIG. 24(B)
Figure 26A:
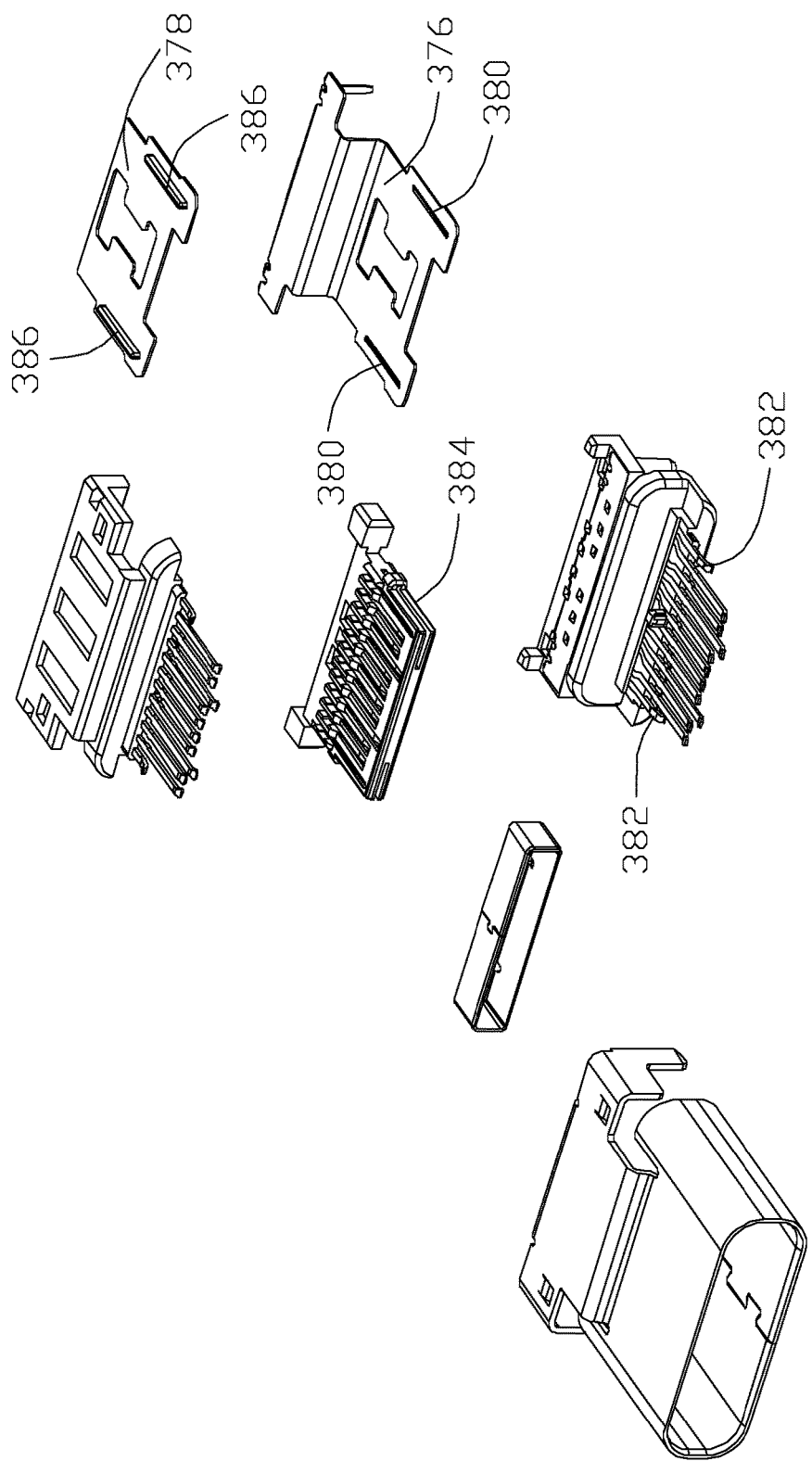
FIG. 26(A) is a further front exploded view of the receptacle connector of FIG. 25(A).
Figure 26B:
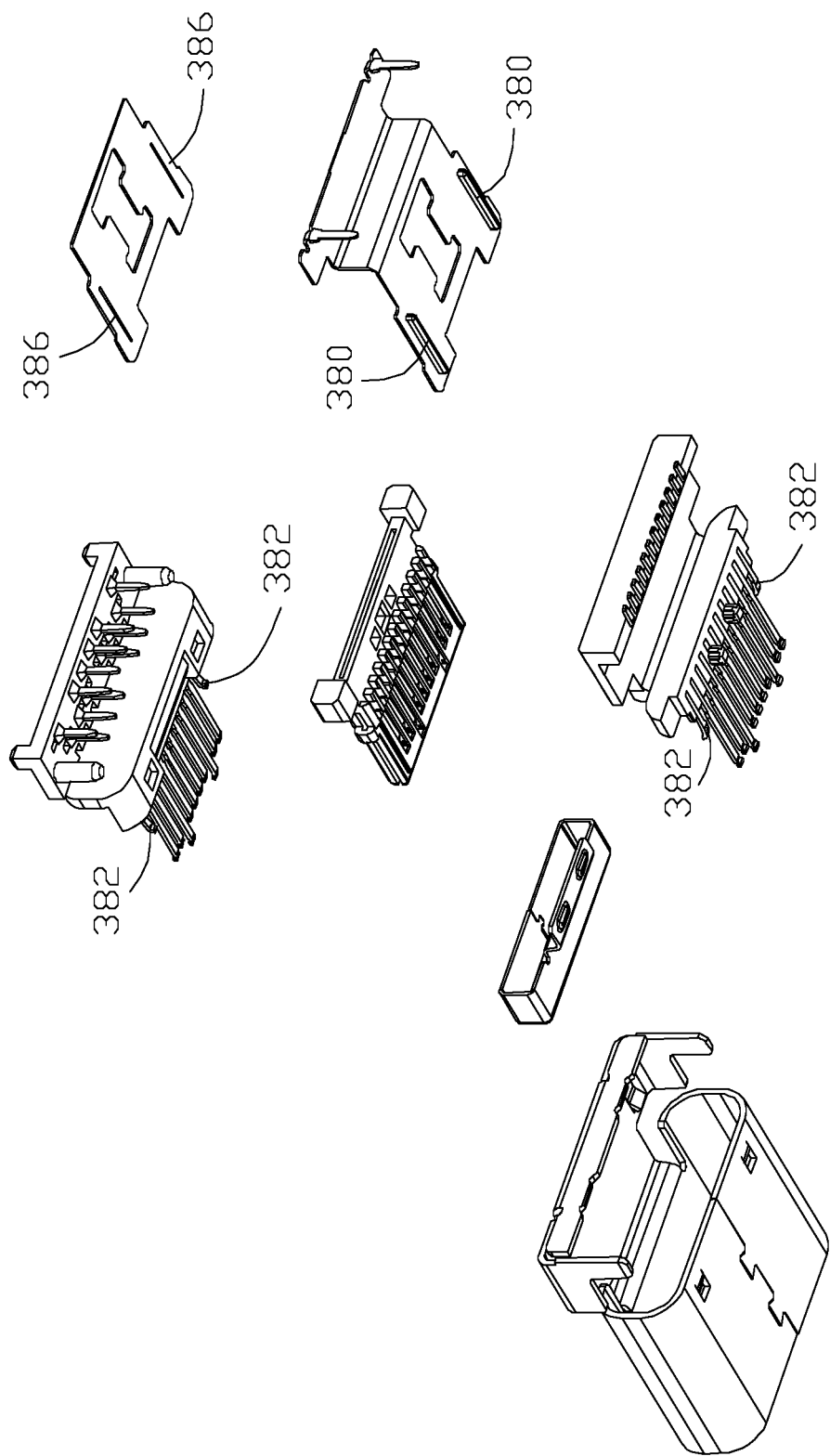
FIG. 26(B) is a further front exploded view of the receptacle connector of FIG. 25(B).
Figure 27:
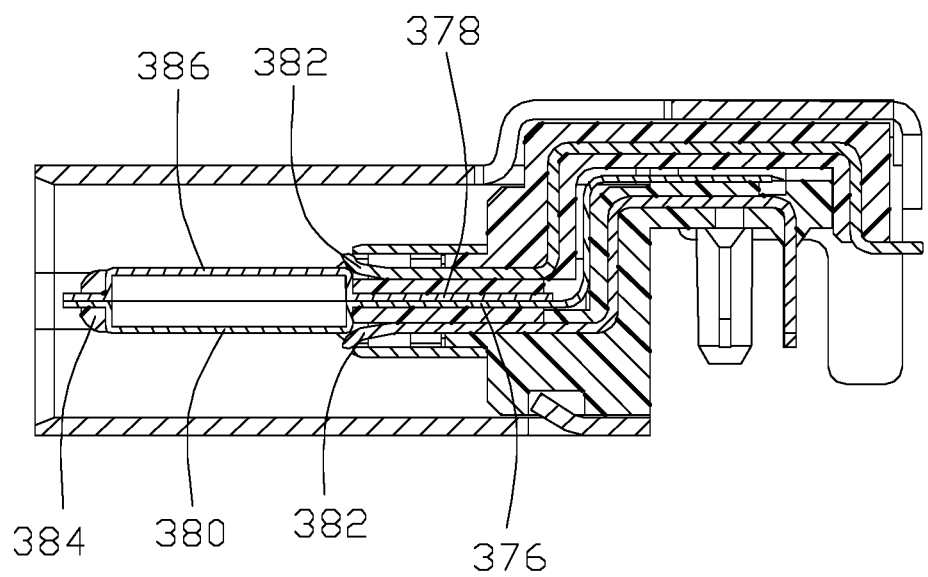
FIG. 27 is a cross-sectional view of the receptacle connector of FIG. 23.

In this embodiment, the paddle card 138 and the insulator 132 are enclosed within a metallic shell set composed of a first half shell 144 and a second half shell 146 which are assemble to each other in a vertical direction perpendicular to both the front-to-back direction and the lateral direction. Each of the first and second half shell 144, 146 is mechanically and electrically connected to the shell 116 in a vertical direction. Understandably, as shown in FIG. 22, the shell set could be alternately made of one piece via bending/forming to form the rectangular tube configuration with the sealed seam, or even in form of a seamless rectangular tube. It is optional to apply an insulator 158, i.e., the so-called inner mold, between the shell set 144, 146 and the paddle card 13 as a protection device. Finally, an insulative cover or an overmold 149 is applied upon the rear section of the shell 116, the shell set 144, 146 and a front section of the cable 141 to form the complete plug/cable connector 110. Optionally, in this embodiment, an LED (Laser Emitting Device) 160 may be mounted upon the paddle card 138 and applying the corresponding light to an exterior via a light pipe set (not shown) linked between the LED and the exterior so as to let the user to identify the operation status thereof. Additionally, a ring type magnetic set (not shown) could be optically located on a front face of the cover of the plug connector to actuate magnetic attraction between the shield of the receptacle connector and the shell of the plug connector.

FIGS. 39-45 shows seventh embodiment of a portion of the plug connector including an insulative housing 412 with a pair of side slots 413, two rows of contacts 418, an insulative spacer 434 and a paddle card 438. The structures of the plug connector are similar to those disclosed in the first embodiment except the latch 439 defines an H-shaped configuration instead of the U-shaped configuration. The latch 439 includes a transverse bar 440 with a pair of latching arms 441 respectively extending forwardly at two opposite ends to reach the receiving cavity in the housing and retained in the side slots 413, and a pair of mounting legs 443 respectively rearwardly extending from the two opposite ends restrictively through the guiding slots 435 of the spacer 434 to reach the paddle card 438 wherein each of the latching arms 441 includes a locking head 442 for locking to the shielding plate of the corresponding receptacle connector for grounding and latching and the mounting leg 443 is soldered to the paddle card 438 for grounding.

However, the disclosure is illustrative only, changes may be made in detail, especially in matter of shape, size, and arrangement of parts within the principles of the invention.

What is claimed is:

1. A receptacle connector for use with a plug, comprising:
an insulative housing defining a base and a mating tongue extending, with a thickened step portion defined at a root region of the mating tongue, the mating tongue is used to be inserted into a mating plug connector;
a plurality of contacts disposed in the housing with contacting sections exposed upon opposite first and second surfaces of the mating tongue and categorized with signal contacts, power contacts and grounding contacts; and
a pair of metallic plates covering the first and second surfaces of the step portion respectively;
wherein each of the metallic plates mechanically and electrically connects to the corresponding grounding contacts.

2. The receptacle connector as claimed in claim 1, wherein each of the metallic plates forms at least one spring tab to contact the grounding contacts.

3. The receptacle connector as claimed in claim 1, wherein each of metallic plate forms two spring tabs respectively at two lateral ends thereof.

4. The receptacle connector as claimed in claim 3, wherein the spring tabs extend forwards.

5. The receptacle connector as claimed in claim 1, wherein a retaining plate extends from a rear edge of the metallic plate, which is retained in a slit of the insulative housing.

6. The receptacle connector as claimed in claim 1, further comprising a shielding plate embedded in the mating tongue and forming a pair of locking edges in two opposite lateral side edges thereof.

7. A receptacle connector for mating with a plug connector, comprising:
an insulative housing including a base and a mating tongue extending forwardly therefrom, with a thickened step structure formed upon a root region of the mating tongue;
a metallic shell enclosing said housing to define a mating cavity in which said mating tongue extends;
a plurality of contacts disposed in the housing with corresponding contacting sections exposed upon a first surface and a second surface of the mating tongue, said contacts being categorized with signal contacts, power contacts and shortened grounding contacts without any contacting portion;
a shielding plate embedded with the mating tongue and forming a pair of notches in two opposite lateral side edges as a locking device;
wherein the shielding plate defines a pair of protrusions unitarily bulged downwardly therefrom to replace and function as corresponding grounding contacting section for corresponding shortened grounding contacts to be exposed on the second surface of the mating tongue.

8. The receptacle connector as claimed in claim 7, comprising a subsidiary plate, wherein the subsidiary plate forms a pair of bulged protrusions unitarily extending upwardly to be exposed upon the first surface of the mating tongue for replacement and functioning as grounding contacting section of the corresponding shortened grounding contact.

9. The receptacle connector as claimed in claim 7, comprising a pair of switch contacts are located around a front face of the base and spaced from each other when no plug is inserted into the mating cavity while contacting with each other when the plug connector is inserted into the mating cavity.

10. The receptacle connector as claimed in claim 9, wherein a front end of said shortened grounding contact extends toward a front edge region of the step portion.

11. The receptacle connector as claimed in claim 10, comprising a pair of metal plates fitly and wholly covering the first and second surfaces of the step portion respectively, wherein said front end of said shortened grounding contact intimately confronts a corresponding front edge region of the metallic plate.

12. A receptacle connector for use with a plug, comprising:
an insulative housing defining a rear base and a front mating tongue forwardly extending, with a thickened step portion defined at a root region of the mating tongue;
a plurality of contacts disposed in the insulative housing with contacting sections exposed upon the first and second surfaces of the mating tongue and categorized with signal contacts, power contacts and grounding contacts;

a metallic shell comprising a capsular mating portion enclosing the mating tongue so as to define a capsular mating cavity between the capsular mating portion and the mating tongue;
a shielding plate embedded in the mating tongue; and
a metallic bracket attached upon the capsular mating portion;
wherein the metallic bracket is fixed with a plurality of fixing points, and extends a pair of supporting legs at opposite sides of the capsular mating portion for mounting on a printed circuit board;
wherein the shielding plate defines a pair of mounting legs, the mounting legs and corresponding solder portions of the corresponding grounding contacts share a same through hole on the printed circuit board.

13. The receptacle connector as claimed in claim 12, wherein there are a plurality of inward bumps at the soldering points.

14. The receptacle connector as claimed in claim 12, wherein the capsular mating portion has a front row of soldering points and a rear row of soldering points.

\* \* \* \* \*